(12) United States Patent
Woolley et al.

(10) Patent No.: US 10,597,289 B1
(45) Date of Patent: Mar. 24, 2020

(54) 3D PRINTER, RESIN, AND INTERCONNECT

(71) Applicants: Adam Woolley, Orem, UT (US); Gregory Nordin, Lindon, UT (US); Hua Gong, Yichun (CN)

(72) Inventors: Adam Woolley, Orem, UT (US); Gregory Nordin, Lindon, UT (US); Hua Gong, Yichun (CN)

( * ) Notice: Subject to any disclaimer, the term of this patent is extended or adjusted under 35 U.S.C. 154(b) by 0 days.

(21) Appl. No.: 16/219,832

(22) Filed: Dec. 13, 2018

Related U.S. Application Data

(63) Continuation-in-part of application No. 16/034,210, filed on Jul. 12, 2018.

(60) Provisional application No. 62/575,319, filed on Oct. 20, 2017, provisional application No. 62/533,607, filed on Jul. 17, 2017.

(51) Int. Cl.
| | |
|---|---|
| *B81C 1/00* | (2006.01) |
| *B33Y 10/00* | (2015.01) |
| *B33Y 70/00* | (2020.01) |
| *B33Y 80/00* | (2015.01) |
| *B33Y 30/00* | (2015.01) |

(52) U.S. Cl.
CPC ...... *B81C 1/00373* (2013.01); *B81C 1/00119* (2013.01); *B33Y 10/00* (2014.12); *B33Y 30/00* (2014.12); *B33Y 70/00* (2014.12); *B33Y 80/00* (2014.12); *B81C 2201/0185* (2013.01)

(58) Field of Classification Search
CPC .................. B81C 1/00373; B81C 1/00119
USPC .......................................................... 257/43
See application file for complete search history.

(56) References Cited

U.S. PATENT DOCUMENTS

2009/0281250 A1\* 11/2009 DeSimone .......... B29C 66/9534
525/418
2017/0371243 A1\* 12/2017 Farah .................... G03F 7/0752

\* cited by examiner

*Primary Examiner* — Elias Ullah
(74) *Attorney, Agent, or Firm* — James Sonntag; Amy Fiene

(57) ABSTRACT

Custom 3d printer and resin for microfluidic flow channels and 3D printed high density, reversible, chip-to-chip microfluidic interconnects.

22 Claims, 34 Drawing Sheets
(32 of 34 Drawing Sheet(s) Filed in Color)

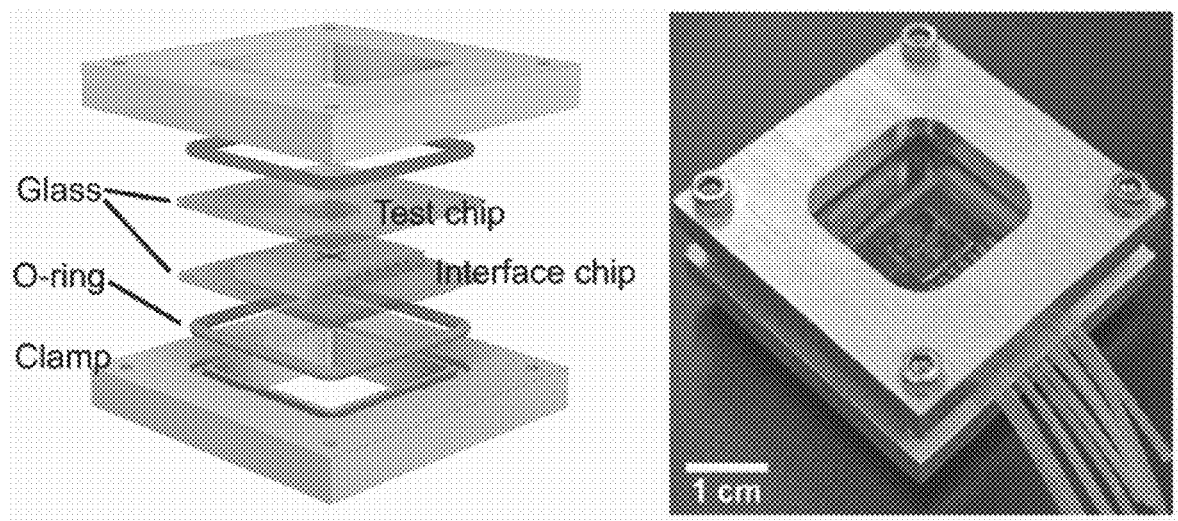
FIG. 12A
FIG. 12B
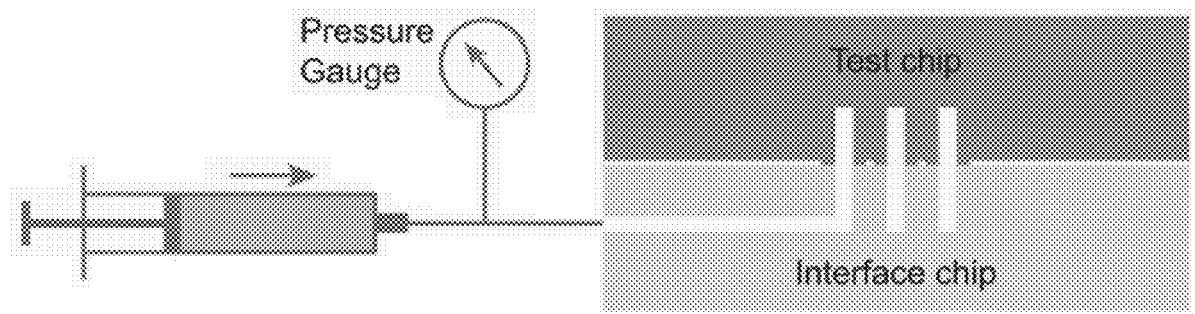
FIG. 12C

3D PRINTER, RESIN, AND INTERCONNECT

CROSS REFERENCE TO RELATED APPLICATIONS

This application is a continuation-in-part to U.S. patent application Ser. No. 16/034,210, filed Jul. 12, 2018, which claims priority from U.S. Provisional Patent Application 62/575,319, filed Oct. 20, 2017, and from U.S. Provisional Application 62/533,607, filed Jul. 17, 2017, all of which are hereby incorporated by reference

FEDERAL SUPPORT

This invention was made with government support under Grant Numbers R01EB006124 and R15GM123405 awarded by the National Institutes of Health. The government has certain rights in the invention.

BACKGROUND

While there is great interest in 3D printing for microfluidic device fabrication, to-date the achieved feature sizes have not been in the truly microfluidic regime (<100 µm).

SUMMARY

As used herein and in the claims, the term "microfluidic" as used to describe a device, channel, fluid portal and the like, is defined as having fluid passages dimensioned less that 100 µm. This refers, for example, to channels having any cross-section dimension less that 100 µm, or a fluid portal in a surface with any dimension less that 100 µm.

The present disclosure involves 3D printing where a microfluidic device is formed layer by layer by applying a layer of uncured resin and curing to crosslink the layer by exposure to UV light from a patterned UV source.

Disclosed is a method for forming a microfluidic device that regulates exposure of the light to layers underlying the layer being cured. The UV light penetrates for cure the upper layer, but is blocked for lower layers that may deliberately have uncured resin regions for forming voids. A method for manufacturing a microfluidic device is disclosed where the resin of the layers includes a UV light absorber having an absorption spectrum that fully overlaps the spectrum of the UV source. This results in little or no exposure of underlying layers to the UV and preserves any pattern of cured/uncured resin in those layers.

Another aspect is curing a single layer not only with a single exposure, but also by multiple exposures. Each subsequent exposure is patterned to increase cross-linking in a particular region. This allows reinforcement of certain regions. For example, one can narrow a channel by adjusting the dose in the area immediately adjacent to the channel such that the dose next to the channels is different than in the rest of a layer. Here the term "adjust" could mean increasing or decreasing the dose in selected areas, such as next to the channels. This technique can be used to strengthen regions, such as the walls of channels and other voids in the final product.

Another aspect is a method for interconnecting microfluidic devices. The method involves using a microgasket around microfluidic portals in the flat interface surface of, for example, a device microfluidic chip or to-world interface chip. Either surface may be treated with microgaskets on the surface around its microfluidic portals. When joined with the flat portal surface of another microfluidic device, the gaskets compress to create a seal around the microfluidic portals and allow fluid transfer from microfluidic device to another through microfluidic portals. Compression of the microgasket and ease of creation of the seal can be provided by a trench or ditch formed in the surface adjacent to the microgasket. This allows the microgasket to compress and displace into the trench from pressure exerted by the clamping force, and allows a better seal and a more even sealing force of the microgasket.

Herein it is demonstrated that a custom Digital Light Processor stereolithographic (DLP-SLA) 3D printer and a specifically-designed, low cost, custom resin can readily achieve flow channel cross sections as small as 18 µm×20 µm. The 3D printer has a projected image plane resolution of 7.6 µm and uses a 385 nm LED, which dramatically increases the available selection of UV absorbers for resin formulation compared to 3D printers with 405 nm LEDs. Beginning with 20 candidate absorbers, demonstrated is the evaluation criteria and process flow required to develop a high-resolution resin. In doing so, a new mathematical model for characterizing the resin optical penetration depth based only on measurement of the absorber's molar absorptivity is introduced. The final resin formulation uses 2-nitrophenyl phenyl sulfide (NPS) as the UV absorber. Also developed is a novel channel narrowing technique that, together with the new resin and 3D printer resolution, enables small flow channel fabrication. Demonstrated is the efficacy of this approach by fabricating 3D serpentine flow channels 41 mm long in a volume of only 0.12 $mm^3$, and by printing high aspect ratio flow channels 13 µm wide and 3 mm tall. These results indicate that 3D printing is finally positioned to challenge the preeminence of methods such as soft lithography for microfluidic device prototyping and fabrication.

Developments in miniaturizing 3D printed microfluidics as described here, and [Gong et al., Lab Chip, 2016, 16, 2450; Gong et al., Lab Chip, 2017, 17, 2899] offer the opportunity to fabricate highly integrated chips that measure only a few mm on a side. For such small chips, an interconnection method is needed to provide the necessary world-to-chip reagent and pneumatic connections. In this disclosure, are introduced simple integrated microgaskets (SIMs) and controlled-compression integrated microgaskets (CCIMs) to connect a small device chip to a larger interface chip that implements world-to-chip connections. SIMs or CCIMs are directly 3D printed as part of the device chip, and therefore no additional materials or components are required to make the connection to the larger 3D printed interface chip. A 121 chip-to-chip interconnections in an 11×11 array for both SIMs and CCIMs with an area density of 53 interconnections per $mm^2$ are demonstrated. Also shown is they withstand fluid pressures of 50 psi. Further demonstrated is their reusability by testing the devices 100 times without seal failure. Scaling experiments show that 20×20 interconnection arrays are feasible and that the CCIM areal density can be increased to 88 interconnections per $mm^2$. Utility of spatially distributed discrete CCIMs is shown by using an interconnection chip with 28 chip-to-world interconnects to test 45 3D printed valves in a 9×5 array. Each valve is only 300 µm in diameter (the smallest yet reported for 3D printed valves). Every row of 5 valves is tested to at least 10000 actuations, with one row tested to 1000000 actuations. In all cases, there is no sign of valve failure, and the CCIM interconnections prove an effective means of using a single interface chip to test a series of valve array chips.

BRIEF DESCRIPTION OF DRAWINGS

The patent or application file contains at least one drawing executed in color. Copies of this patent or patent application publication with color drawing(s) will be provided by the Office upon request and payment of the necessary fee.

FIG. 3D Measured polymerization thickness as a function of exposure time for 13 resins. Each resin contains 1% Irgacure 819 in addition to the specified UV absorber. Dashed lines indicate fit to Model 3. Inset shows that Model 4 (solid lines) is a better fit for some resins.

FIG. 5B Calculated normalized dose as a function of depth for the 3 layer cases in

FIG. 5A.

FIG. 12A Clamping mechanism for interface and test chips.

FIG. 12B Photo of clamped interface and test chips ready for pressure testing.

FIG. 12C Schematic illustration of the pressure test set-up. The syringe pump is connected sequentially to individual tubes to pressure test each associated interconnection port microgasket.

FIG. 16A 11×11 interconnect array test set-up.

FIG. 19E (lower) is close-up of the 45-valve array with each row of valves having their control ports connected in series to a pair of CCIMs, and each column of valves having their fluid ports connected in series to a pair of CCIMs. Each valve is 300 µm in diameter.

DETAILED DESCRIPTION

Figure 1:
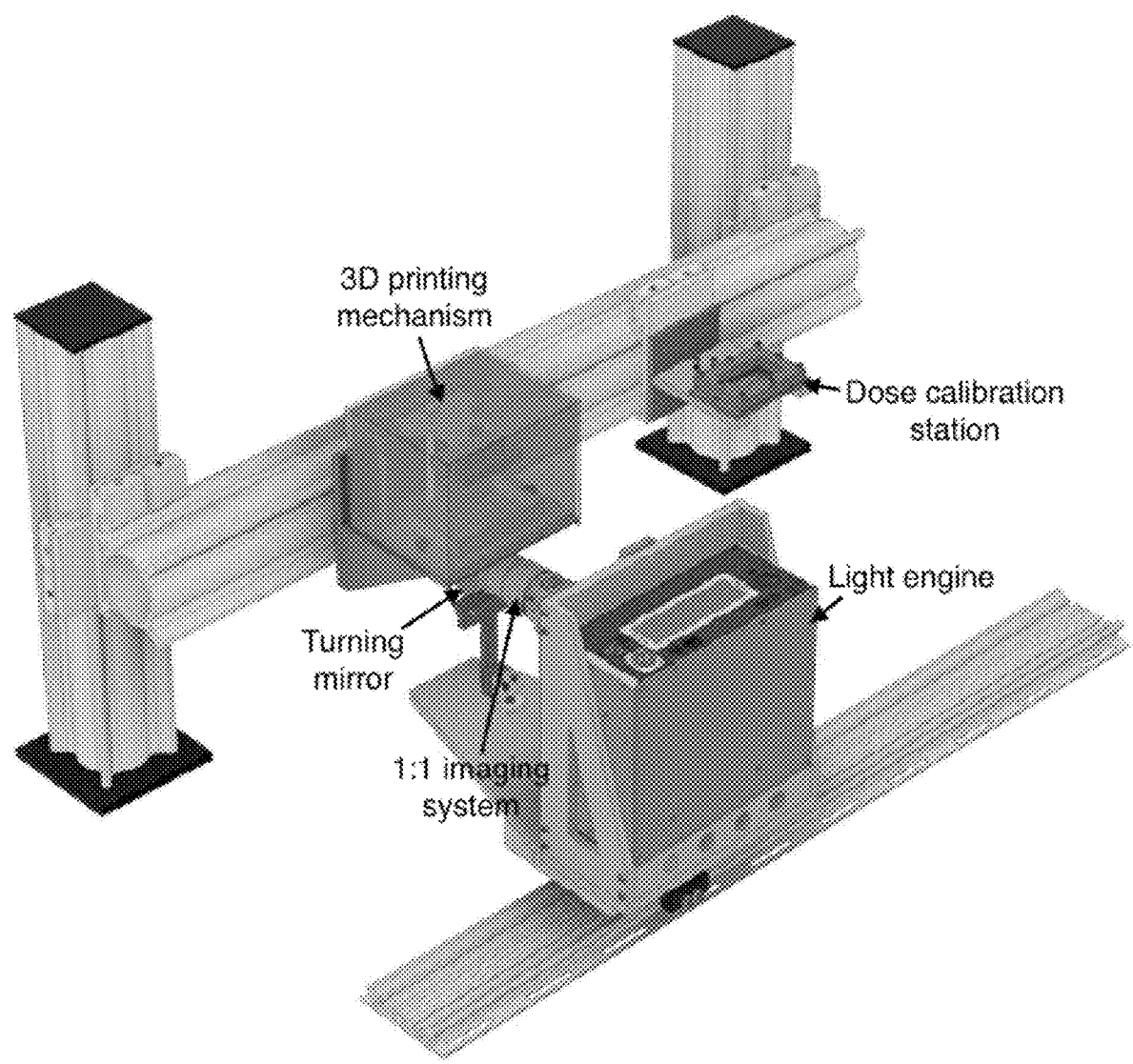
FIG. 1 3D CAD model of an exemplary custom 3D printer.

This section is divided in two parts. Part I relates to "Custom 3d printer and resin for microfluidic flow channels" and Part 2 relates to "3D printed high density, reversible, chip-to-chip microfluidic interconnects". These parts disclose matter from the two papers, (1) Hua Gong, Bryce P. Bickham, Adam T. Woolley, Gregory P. Nordin. Custom 3D printer and resin for 18 µm×20 µm microfluidic flow channels. *Lab Chip*, 2017; DOI: 10.1039/C7L-C00644F, and (2) Hua Gong, Adam T. Woolley and Gregory P. Nordin. 3D printed high density, reversible, chip-to-chip microfluidic interconnects *Lab Chip* 2018, 18 639, DOI 10 1029/c7ic01113j, both of which are hereby incorporated by reference.

Detailed Description—Part I

"Custom 3d Printer and Resin for Microfluidic Flow Channels"

1 Introduction

As evidenced by numerous recent reviews,[1-10] the advantages of 3D printing for microfluidic device fabrication are increasingly being recognized. Digital Light Processing stereolithography (DLP-SLA) is an especially attractive lower-cost 3D printing approach for microfluidics,[11,12] particularly since a microfluidic device is essentially a series of linked voids in a bulk material. During DLP-SLA fabrication, such voids are regions of unpolymerized resin that must be flushed after 3D printing, which is an easier process than trying to remove a solid sacrificial support as required by other 3D printer technologies such as polyjet.[13,14] Unfortunately, as shown in Ref. 11, current commercial 3D printing tools and materials are unable to fabricate truly microfluidic voids (<100 µm), and hence 3D printed devices are at best in the large microfluidic regime (100-500 µm),14-20 but more often in the millifluidic (>1 mm)[13,21-23] or sub-millifluidic (0.5-1.0 mm)[24-30] regimes (see Ref. 12 for a review of 3D printed microfluidics in terms of these size categories).

It has been shown that custom resin formulation in conjunction with a relatively high resolution DLP-SLA 3D printer (27 µm pixel pitch in the image plane) enabled formation of 3D print microfluidic flow channels with cross sectional area (108 µm×60 µm) near the boundary between the microfluidic and large microfluidic regimes.[11] These advances were leveraged to 3D print very compact valves and pumps, leading to the demonstration of high density integration of such components in a 3-to-2 microfluidic multiplexer with a fully 3D layout, thereby illustrating some of the advantages of 3D printing for microfluidics.[31]

Here is shown how 3D printing can be further extended to fabricate microfluidic flow channels with cross sectional area small enough to be truly in the microfluidic regime. The approach is to construct a customized high resolution 3D printer (7.6 µm pixel pitch in the image plane) and develop a custom resin specifically tailored to take advantage of the 385 nm LED spectrum of the 3D printer. Moreover, here is introduced a new channel narrowing technique that results in reliably printing flow channels as small as 18×20 pmt, which is 18 times smaller than previous results in Ref. 11. To demonstrate the efficacy of this approach, 41 mm long 3D serpentine flow channels were fabricated in a volume of only 1.56 mm×0.38 mm×0.21 mm=0.12 mm³. Also demonstrated is high aspect ratio channels 13 µm wide and 3 mm tall. In short, it is shown that when appropriately applied, DLP-SLA is an effective method to 3D print truly microfluidic voids, which lays the foundation for 3D printing to challenge the dominance of conventional methods of microfluidic prototyping and development such as soft lithography and hot embossing.

2 Materials and Methods 2.1 Custom 3D Printer

Two most important design criteria for constructing a custom 3D printer for microfluidics are a high resolution light engine and a UV LED light source. The former is critical to achieve small inplane (x-y) void size, while the latter enables a wider selection of materials for custom resin formulation than the 405 nm sources that have previously been worked with.[11] As shown in Sect. 3.1, creating a resin with the correct optical properties relative to the light source is critical to achieve small out-of-plane (z dimension) void size.

An exemplary 3D printer design is shown in FIG. 1. It comprises a light engine, a 45° turning mirror with 3 axes of adjustment, a 3D printing mechanism, and custom-made mounts. The light engine and turning mirror are attached to a common base, which in turn is mounted to a rail so that the assembly can be conveniently shifted between the 3D printing mechanism on the left and a resin dose calibration set up (detailed in Sect. 2.4) on the right.

The light engine (Visitech, Lier, Norway) is based on a TI DLP9000 (Texas Instruments) containing a 2560×1600 micromirror array. With a 1:1 imaging system, the image plane resolution is 7.6 µm and the projected area is 19.35× 12.10 mm². The optical source in the light engine is a 385 nm LED. The peak wavelength and full-width at half-maximum (FWHM) of the source is measured to be 383.4 nm and 12.6 nm, respectively. The 45° turning mirror reflects light from the horizontally mounted light engine such that projected patterns can be focused through the transparent bottom of a resin tray. A Solus 3D printing mechanism (Junction3D, Santa Clarita, Calif.) is heavily modified to serve as a platform for the 3D printing process. The bottom of the resin tray is a replaceable teflon film that is tensioned on an underlying quartz window to guarantee flatness.

Customized Python software was developed to operate the printer. The software controls the 3D printing mechanism over a serial channel using G-code and the light engine over I²C to a low-level hardware interface. Images are sent with a graphics card through HDMI. All synchronization of 3D printer functions is performed in the Python code. The code gives absolute control over all aspects of the 3D printer, including arbitrary exposure times for arbitrary layers during a 3D print, multiple independent exposures per layer, variable layer thicknesses, and, most importantly, single pixel precision in the projected images.

2.2 Materials

The focus of the resin formulation efforts is finding one or more UV absorbers that will give the optical properties needed to achieve small void size in the z dimension. Similar to previous work,[11,19,31] used were poly(ethylene glycol) diacrylate (PEGDA, MW258) as the monomer and phenyl-bis(2,4,6-trimethylbenzoyl)phosphine oxide (Irgacure 819) as the photoinitiator. They are obtained from Sigma-Aldrich (St. Louis, Mo.) and BASF (Vandalia, Ill.), respectively.

Figure 2:
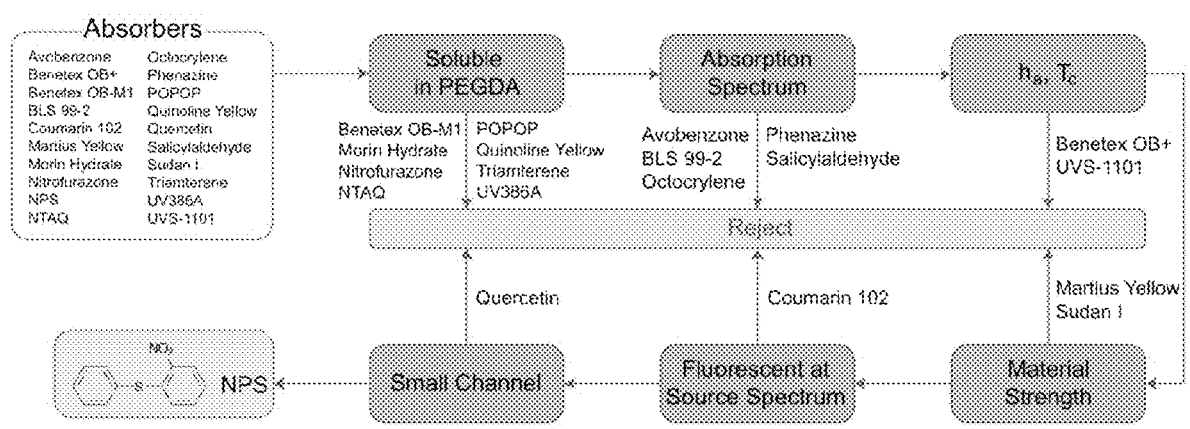
FIG. 2 UV absorber evaluation criteria and process flow. 20 absorbers are initially considered. Rejected absorbers are indicated at each step in the process where they do no pass the evaluation criterion FIG. 3A Measured molar absorptivity and LED source spectrum.
Figure 11:
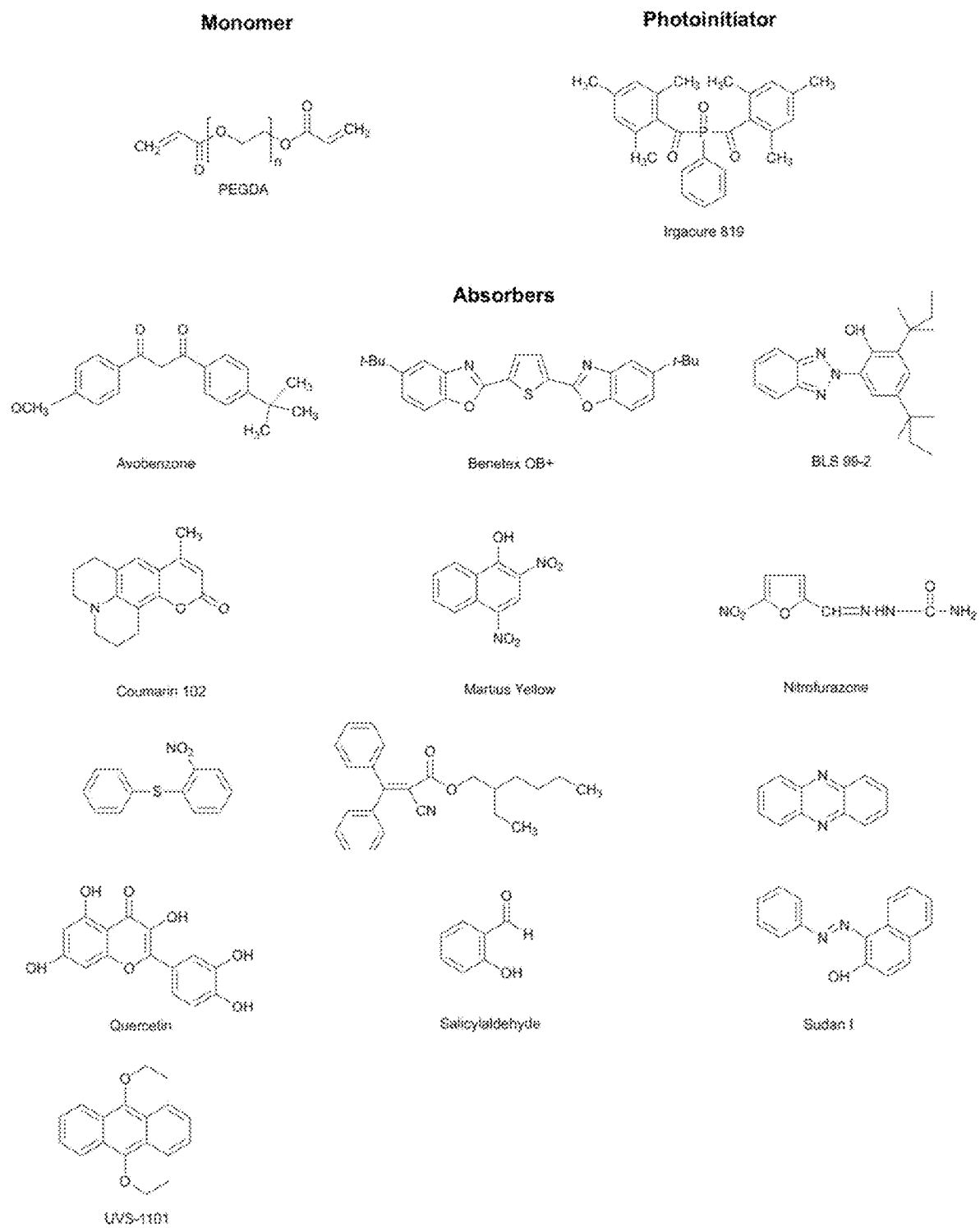
FIG. 11 shows molecular structures for monomer, photoinitiator, and UV absorbers.

As indicated in FIG. 2, 20 potential UV absorbers were evaluated. Their molecular structures are shown in FIG. 11

The absorbers are avobenzone, 2,5-bis(5-tert-butyl-benzoxazol-2-yl)thiophene (Benetex OB+), disodium 4,4'-bis(2-sulfonatostyryl)biphenyl (Benetex OB-M1), benzenepropanoic acid (BLS 99-2), 2,3,6,7-tetrahydro-9-methyl-1H,5H-quinolizino(9,1-gh)coumarin (Coumarin 102), Martius Yellow, morin hydrate, nitrofurazone, 2-nitrophenyl phenyl sulfide (NPS), 5,12-naphthacenequinone (NTAQ), octocrylene, phenazine, 1,4-bis-(2-(5-phenyloxazolyl))-benzene (POPOP), Quinoline Yellow, 3,3',4',5,6-pentahydroxyflavone (Quercetin), salicylaldehyde, Sudan I, triamterene, UV386A, and 9,10-diethoxyanthracene (UVS-1101). Avobenzone and octocrylene are purchased from Making-Cosmetics (Snoqualmie, Wash.); Benetex OB+, Martius Yellow, morin hydrate, Quinoline Yellow, quercetin, and Sudan I from Sigma-Aldrich (St. Louis, Mo.); Benetex OB-M1, nitrofurazone, and NPS from TCI America (Portland, Oreg.); Coumarin 102, triamterene, and UVS-1101 from Alfa Aesar (Haverhill, Mass.); BLS 99-2 from Mayzo (Suwanee, Ga.); NTAQ and phenazine from Santa Cruz Biotechnology (Dallas, Tex.); salicylaldehyde from Thermo Fisher Scientific (Waltham, Mass.); and UV386A from QCR Solutions (St. Lucie, Fla.). Each chemical is used as received.

Resins studied for 3D printing are prepared by mixing 1% (w/w) Irgacure 819 and the desired concentration of UV absorber with PEGDA, and sonicating for 30 min. All photoinitiator-containing resins are stored in amber glass bottles after mixing.

2.3 Molar Absorptivity Measurement

The absorption spectrum of each UV absorber is measured by mixing the absorber at a specific concentration with PEGDA and placing a drop of resin in the gap between a glass slide and a coverslip separated by 65 μm spacers. The resin is illuminated through the glass slide with attenuated light from a broadband XCITE120Q source (Lumen Dynamics, Ontario, Canada). The transmitted light is captured by a fiber with 100 μm diameter core connected to a QE65000 spectrometer (Ocean Optics, Dunedin, Fla.). The molar absorptivity is calculated from the measured absorption spectra of resins with and without an absorber, and from the known resin thickness.

2.4 Dose Calibration

Polymerization thickness as a function of optical dose is measured with the set up on the right in FIG. 1, which consists of a custom resin container with a 75×50 mm² glass window in the bottom. When the light engine is shifted on the rail to this calibration station, the height of the resin container is adjusted so that the projected image is focused on the top surface of the window. A layer of resin ~1 mm thick is applied to the window and exposed to a series of 1 mm² square patterns with different exposure times, which results in different polymerization depths. After rinsing unpolymerized resin with isopropyl alcohol (IPA), The thickness of the polymerized regions was measured using a Zeta-20 3D optical profilometer (Zeta Instruments, San Jose, Calif.).

2.5 3D Printing 3D prints are fabricated on diced and silanized glass slides. The silanization procedure is given in Ref. 31, except that a silane concentration of 10% rather than 2%. All 3D prints are exposed with a measured optical irradiance of 21.2 mW/cm$_2$ in the image plane.

2.6 Material Mechanical Properties

As discussed in Sect. 3.2, it was experimentally observed that some UV absorbers appear to hinder the photopolymerization process such that a given dose results in noticeably different material strengths for different absorbers. To illustrate this phenomenon, the hardness and Young's modulus of two resins containing different UV absorbers are measured. Measurements are made with 19.35×12.10×5 mm³ 3D printed blocks of polymerized resin printed with a 5 μm layer thickness. Their Shore hardness is measured with a Rex Gauge Model 1600 durometer (Buffalo Grove, Ill.) for both ASTM D2240 Type A and Type D scales. The Young's Modulus is measured in compression with an Instron 3455 (Instron, Norwood, Mass.).

2.7 Post-Print Curing

In previous work,[31] 0.01% w/w azobisisobutyronitrile (AIBN) was added to the resin to enable post-print thermal curing to drive further polymerization and obtain improved mechanical properties. However, it was found that the 385 nm source of the custom 3D printer activates AIBN such that it is consumed during 3D printing, and is therefore unavailable for post-print thermal curing. An alternate thermal initiator was tried, benzoyl peroxide, but is was found that it was likewise activated during 3D printing. Therefore, an optical curing approach was employed. The key is to use a photoinitiator with absorbance that extends to longer wavelengths than the long wavelength cut off of the UV absorber such that light in this region penetrates through the device. For example, in FIG. 3A, the Irgacure 819 absorption spectrum extends to 460 nm, while NPS and Martius Yellow stop absorbing light at ~440 nm. For post-print optical curing an inexpensive consumer UV nail curer (54 Watt Professional UV Nail Dryer, Royal Nails) that emits a broad spectrum was used.

3 Results and Discussion

This section begins by stepping through the process of developing a custom resin to fabricate truly microfluidic void sizes based on the new custom 3D printer, taking into account the source and UV absorber spectra. A mathematical model was developed from which the optical penetration depth for a resin, $h_a$, can be calculated directly from its measured molar absorptivity and desired absorber concentration, and also determine $h_a$ and the critical exposure time, Tc, (see Ref. 11 for the model details) from experimental measurement of polymerization thickness as a function of exposure time. Assessment led to the selection of NPS as the UV absorber as being suitable, and which is used in the examples. Other UV absorbers are contemplated. Next, evaluation was made of the minimum achievable void size as a function of layer thickness and layer exposure time for 2% w/w NPS concentration. Using calculated dose as a function of z, a model was developed for the minimum achievable void size, and demonstrate that the model is predictive by applying it to 3% NPS resin to get flow channels with a design height of 18 μm. Then there was introduction of a new channel narrowing technique that reduces channel width from ~38 μm to ~20 μm. Finally, demonstrated is the utility of the current methods by fabricating 41 mm long 3D serpentine flow channels and high aspect ratio flow channels.

3.1 Absorber Selection

3.1.1 Criteria

The approach to evaluating UV absorber candidates is illustrated in FIG. 2, which was applied to 20 candidate absorbers. These candidates were primarily found by examining chemical manufacturer websites and manually assessing absorption spectra in the 20 volumes of Ref. 32.

Most UV absorbers are powders that must be mixed with PEGDA, a liquid. The first test criterion is therefore whether the absorber is soluble. Table 1 shows the results of the solubility measurements. Seven of the 20 candidate absorbers are found to be insoluble in PEGDA and an eighth, nitrofurazone, has such a low solubility (0.07%) that it is unusable.

TABLE 1

Solubility in PEGDA and fluorescence with 385 nm excitation. Dash indicates insolubility.

| Material | Solubility (%) | Fluorescent |
|---|---|---|
| Avobenzone | >5 | |
| Benetex OB+ | 0.25 | Yes |
| Benetex OB-M1 | — | Yes |
| BLS 99-2 | >5 | |
| Coumarin 102 | 0.8 | Yes |
| Irgacure 819 | >5 | |
| Martius Yellow | 3 | |
| Morin Hydrate | — | |
| Nitrofurazone | 0.07 | |
| NPS | >5 | |
| NTAQ | — | |
| Octocrylene | >5 | |
| Phenazine | 1.8 | |
| POPOP | — | Yes |
| Quercetin | 0.8 | |
| Quinoline Yellow | — | |
| Salicylaldehyde | >5 | |
| Sudan I | 2.7 | |
| Triamterene | — | Yes |
| UV386A | — | |
| UVS-1101 | 0.5 | Yes |

Figure 3A:
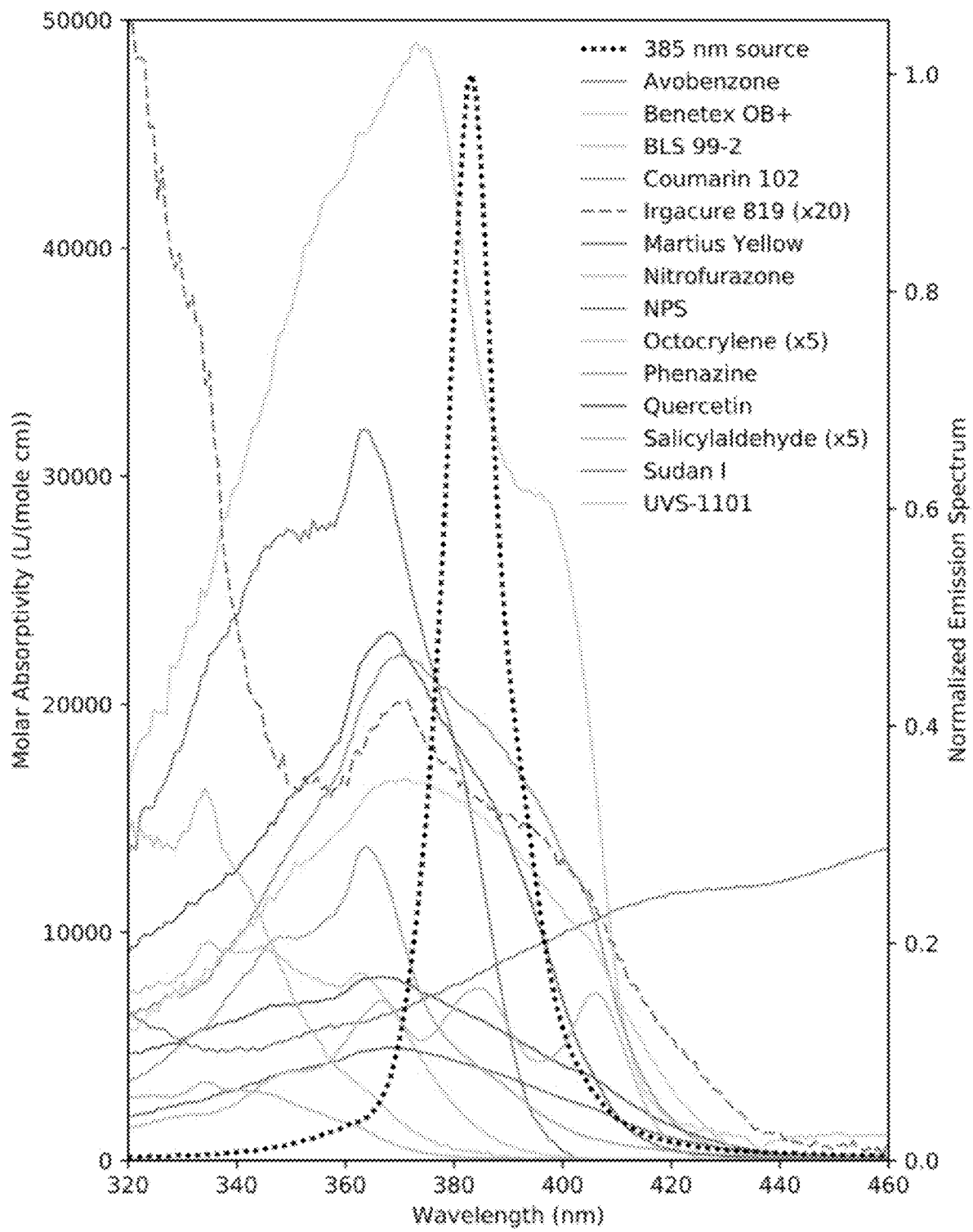
FIG. 3B $D_n(z)$ calculated from molar absorptivity for 1% Irgacure 819 resin.
FIG. 3C Same as FIG. 3B except for 1% Avobenzone and 2% NPS resins.

The next criterion is whether the absorber's absorption spectrum fully overlaps the emission spectrum of the light engine optical source. FIG. 3A shows the measured molar absorptivity as a function of wavelength for the remaining absorber candidates. It also shows the molar absorptivity of the photoinitiator, Irgacure 819, and the light engine source spectrum. As is evident from FIG. 3A, five absorber candidates have poor spectral overlap with the source. In each case, the absorber's long wavelength tail is insufficient to cover the full source spectrum. The result is that some of the source spectrum will penetrate deeper into the device during 3D printing, causing unpolymerized resin in what should be voids to polymerize and thereby fill the voids. Such absorbers are therefore incapable of being used to fabricate small voids, as shown below.

3.1.2 Mathematical Model

In Ref. 11 it was noted that the polymerization depth, $z_p$ for an exposure time of $t_p$ is:

$$z_p = h_a \ln \frac{t_p}{T_c}, \quad (1)$$

where $h_a = 1/a$ and $a$ is the resin's absorption coefficient. This result assumes monochromatic illumination, which is valid if the absorption coefficient is relatively constant over the source spectrum. However, here is considered wavelength-dependent absorption such that there is a need to develop a more refined model.

Consider a photopolymerizable resin with absorption coefficient $\alpha(\lambda)$ occupying the half space $z \geq 0$ and illuminated by a polychromatic light source, $I_0(\lambda)$, from the $-z$ direction. The dose (J/cm$^2$) at z for exposure time t can be expressed as (see Section 5.2 for a comprehensive comparison of the monochromatic and polychromatic cases)

$$D(z, t) = t \int_0^\infty I_0(\lambda) e^{-\alpha(\lambda)z} d\lambda. \quad (2)$$

Normalizing by the dose at z=0 obtain is, $$D_n(z) = \frac{D(z, t)}{D(0, t)} \quad (3)$$

$$= \frac{\int_0^\infty I_0(\lambda) e^{-\alpha(\lambda)z} d\lambda}{\int_0^\infty I_0(\lambda) d\lambda}. \quad (4)$$

The normalized dose, $D_n(z)$, indicates how rapidly the relative dose decreases as a function of z, and has the functional form of a weighted average of $e^{-\alpha(\lambda)z}$ over $\lambda$ with weighting function $I_0(\lambda)$. Based on many calculations with measured spectra for numerous absorbers, it has been found that this weighted average can be approximated as $$D_n(z) \approx ae^{-z/b} + c \quad (5)$$

$$= 1 - a(1 - e^{-z/b}), \quad (6)$$

where is used $c = 1-a$ in Eq. 6, which can be derived from $D_n(0) = 1$. When there is good spectral overlap between an absorber and the source spectrum, $a = 1$ and the approximation for $D_n(z)$ reduces to $$D_n(z) \approx e^{-z/b_a}, \quad (7)$$

Eq. 7 is referred to as Model 1 and Eq. 6 is referred to as Model 2. Both depend solely on the spectral properties of the absorber and the source. Given the molar absorptivity, $\varepsilon(\lambda)$, from FIG. 3A, the absorption coefficient, $\alpha(\lambda)$, is $$\alpha(\lambda) = \log(10)\varepsilon(\lambda)C \quad (8)$$

where the molar concentration, C, can be calculated from the w/w absorber concentration, $C_{w/w}$, in percent as $$C = \frac{C_{w/w}}{100} \frac{\eta_P}{M_a} \quad (9)$$

in which $n_p$ is the density of PEGDA and $M_a$ is the absorber molar mass.

Figure 3B:
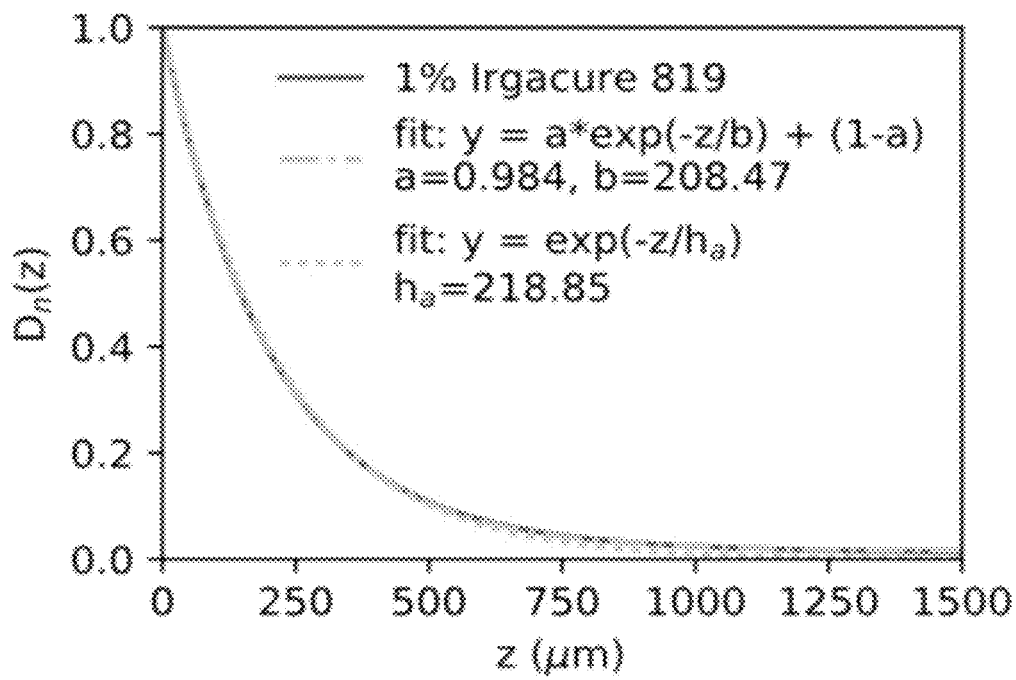
Figure 3C:
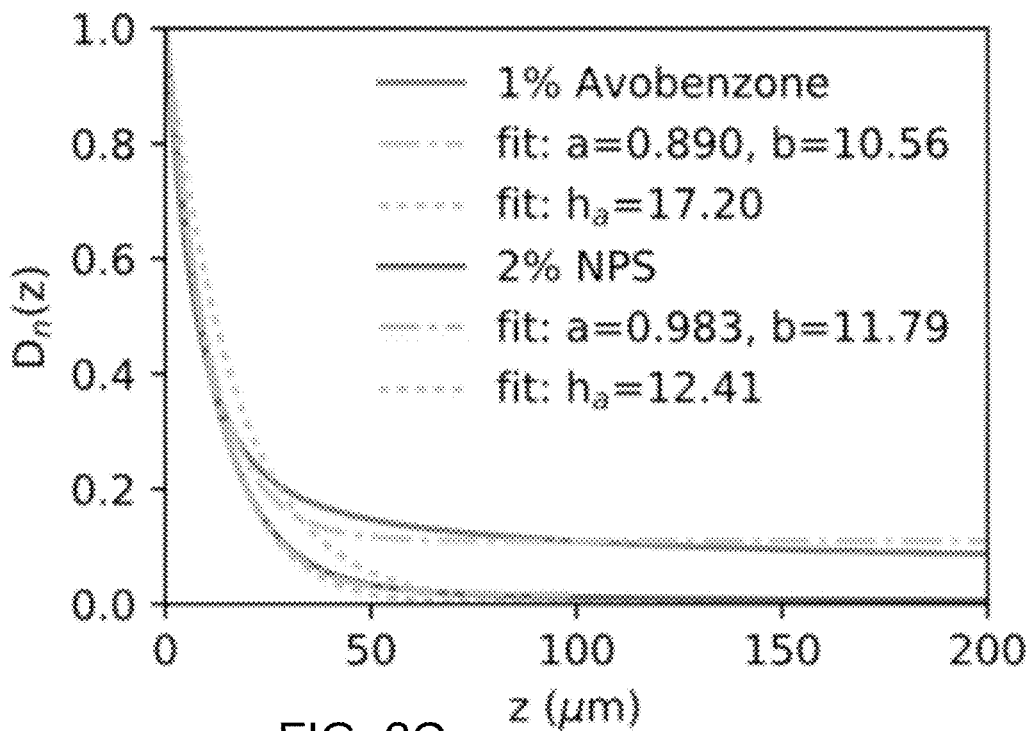
Figure 3D:
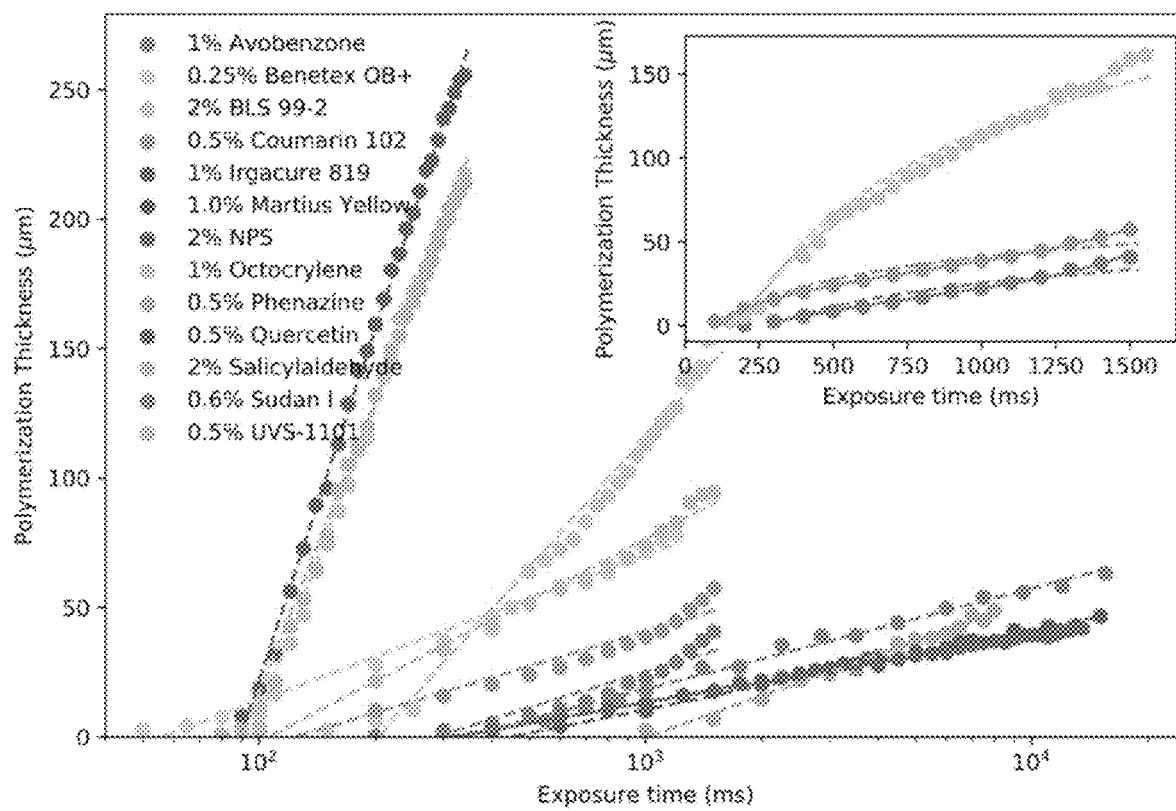

FIGS. 3B and 3C show example calculations of $D_n(z)$ using Eqs. 4 and 8 for three resins based on their measured absorption spectra and the light engine source spectrum. As seen in FIG. 3A, both Irgacure 819 and NPS have good spectral overlap with the source spectrum, such that fitting Model 2 to the calculated $D_n(z)$ yields a very close to 1, in which case b from Model 2 and $h_a$ from Model 1 agree to within 5%. On the other hand, avobenzone does not have good spectral overlap with the source such that a<0.9, and b and $h_a$ differ by 60%. Note that for Irgacure 819 and NPS, $D_n(z) \to 0$ as $z \to \infty$, whereas for avobenzone $D_n(z) \to \sim 0.1$. Hence at depths beyond several $h_a$, NPS resin will remain largely unexposed, whereas avobenzone resin will continue to photopolymerize, making it unusable to fabricate small voids.

3.1.3 Polymerization as a Function of Dose

In Ref. 11 a resin characterization method was used in which the polymerization thickness is measured for a series of exposure times, followed by fitting the data to Eq. 1 to determine $h_a$ and $T_c$. A similar method is employed here, except that when there is poor spectral overlap between the absorber and the source spectrum, the polymerization behavior is better modeled by $$t_p = \frac{T_c}{(1-a) + a\exp(-z_p/b)} \quad (10)$$

(see Sect. 5-3 for derivation). Eq. 1 is referred to as Model 3 and Eq. 10 is referred to as Model 4. These models' fit parameters are based solely on measured polymerization thickness as a function of optical exposure time.

(see shows the measured polymerization thickness as a function of exposure time for a wide selection of custom resins. In each case, the corresponding dashed line shows the fit to Model 3. The inset graph also shows the fit to Model 4 as solid lines for the three resins that have the poorest fit to Model 3 (1.0% avobenzone, 2% BLS 99-2, and 0.5% Coumarin 102).

The fits to Models 1-4 for all of the resins are shown in Table 5 in Section 5. When the fit for a in Models 2 or 4 is ~1, the absorber has good spectral overlap with the source. In this case Models 1 and 3 are valid and typically show good agreement with each other even though they are generated from completely different measurements, thereby indicating the consistency of the analysis methods.

In addition to good spectral overlap, it is also required that ha be suitably small in order to realize 3D printed channels with small vertical void size. Therefore, the choice of absorbers is restricted to those that can achieve the smallest ha, which, in conjunction with previous criteria, limits the possible absorbers to Coumarin 102, Martius Yellow, NPS, Quercetin, and Sudan I.

3.2 Material Properties and Layer Dose

For a given irradiance and build layer thickness, the layer exposure time determines the dose and hence the degree of crosslinking in a layer. Smaller layer exposure times result in less crosslinking and hence less overall hardness and smaller Young's modulus. On the other hand, longer exposure time yields greater hardness and Young's modulus, but increases the exposure of resin in regions intended to be voids, thereby limiting the minimum vertical void size that can be achieved. There is thus a layer exposure time trade-off between material properties and minimum vertical void size. A resin that achieves adequate material properties with a smaller layer exposure time will yield a smaller vertical void size than a resin that requires a longer layer exposure time to obtain the same material properties.

As an example of the effect of two absorbers on material properties as a function of layer exposure time, consider 2% NPS and 1.2% Martius Yellow resins, which have $h_a$ values of 11.2 and 9.8 µm, respectively. Table 2 shows the results of Young's Modulus and Type A and D Shore durometer measurements. For 2% NPS, a layer exposure time of 280 ms yields a somewhat harder and stiffer material than a 500 ms layer exposure time for 1.2% Martius Yellow. When the materials undergo the same length postprint cure, the NPS resin still has greater hardness and Young's modulus. It is therefore expected to achieve significantly smaller vertical void size with the NPS resin, which is consistent with present experimental observations.

TABLE 2

Comparison of Young's modulus and durometer measurements for NPS and Martius Yellow resins. Durometer measurements are unitless and Young's Modulus, E, is in MPa.

| 2% NPS | | | | 1.2% Martius Yellow | | | |
|---|---|---|---|---|---|---|---|
| $t_{exp}$ (ms) | A | D | E | $t_{exp}$ (ms) | A | D | E |
| 280 | 86 | 21 | 3.5 | 500 | 84 | — | 2.7 |
| 400 | 94 | 52 | 6.6 | 1000 | 93 | 70 | 6.7 |
| 280 cured | 97 | 75 | 7.7 | 500 cured | 94 | 47 | 5.5 |

Experience has shown that in making 3D printed valves and pumps,[31] postprint curing is necessary for long valve and pump operational lifetime. Since optical curing is necessary for the reasons discussed in Sect. 2.7, Sudan I is eliminated from consideration because its absorption spectrum extends far beyond the long wavelength limit of Irgacure 819 such that it cannot be optically cured to achieve good material properties.

3.3 Small Cross Section Channels

The ultimate criterion for absorber selection is which absorber(s) result in the smallest cross section channels. Experimentally it is found that Coumarin 102 can yield small channels only when they are close to the last exposed layer; deeper channels are always closed. This is ascribed to the fact that Coumarin 102 is fluorescent at 385 nm. Since fluorescent light is emitted at longer wavelengths than the excitation light, and much of it is beyond the long wavelength cutoff of Coumarin 102 absorption, the fluorescent light can penetrate deeper during printing such that resin in underlying channels is exposed and polymerized. Resin in channels near the surface do not receive enough dose from fluorescence in subsequent layers to become polymerized.

In the case of Quercetin, it was found that small channel sizes could be fabricated, but they exhibited internal delamination. While it may be possible to find conditions in which this does not occur, the choice was to focus efforts on the remaining absorber, NPS.

3.3.1 Channel Height

Extensive testing with 2% NPS reveal a set of conditions that repeatably result in the smallest possible channel height with essentially 100% yield. This can be illustrated with FIG. 4A, in which scanning electron microscope (SEM) images of channel cross sections are shown for the smallest achievable channel height (30 µm) for layer thicknesses, $z_l$, of 5, 7.5, and 10 µm. For 8.3 µm layers, the smallest channel height is 25 µm. A plot of normalized dose as defined in Ref. 11 ($\Omega = D(z)/D_c$)) is shown as a function of $z/z_l$ for a generic case in FIG. 4B for the layers surrounding a flow channel intended to occupy layers 8-10. The normalized dose at the top of the channel is $\Omega_{tot,b}$, which exponentially decays through the thickness of the channel. Successful channel formation requires that this exponential tail is small enough to avoid significant polymerization of resin in the channel.

Figure 4A:
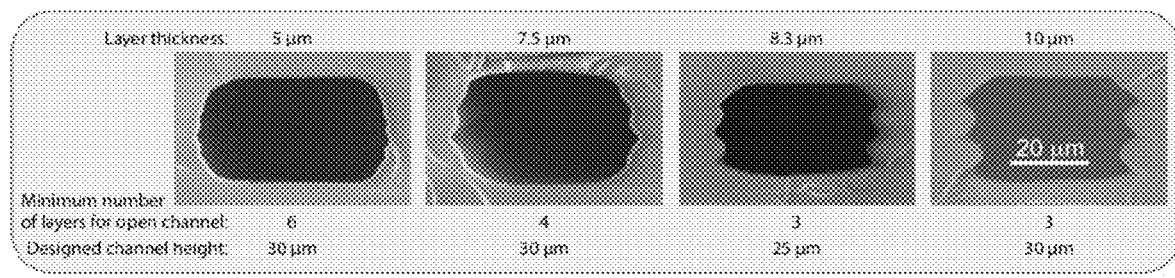
FIG. 4A SEM images of flow channel cross sections for 2% NPS. See text for details. All channels are designed to be 4 pixels wide. Larger layer thickness results in larger vertical wall surface relief.
Figure 4B:
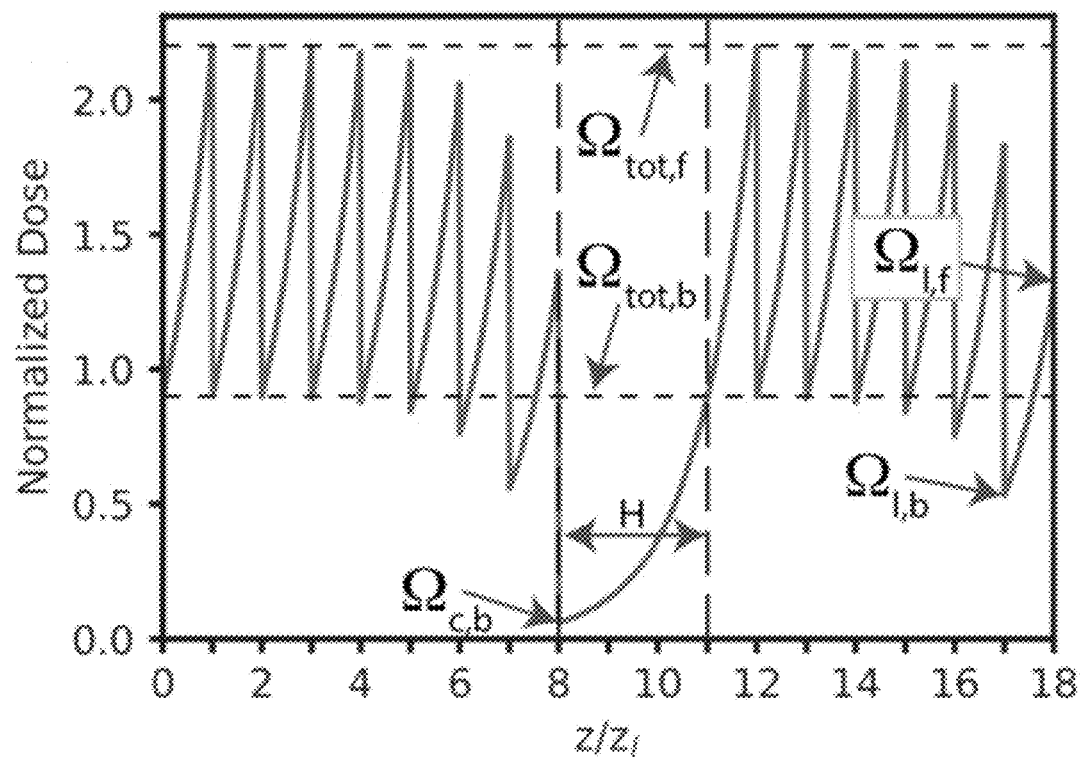
FIG. 4B Normalized dose as a function of normalized depth.
Figure 4C:
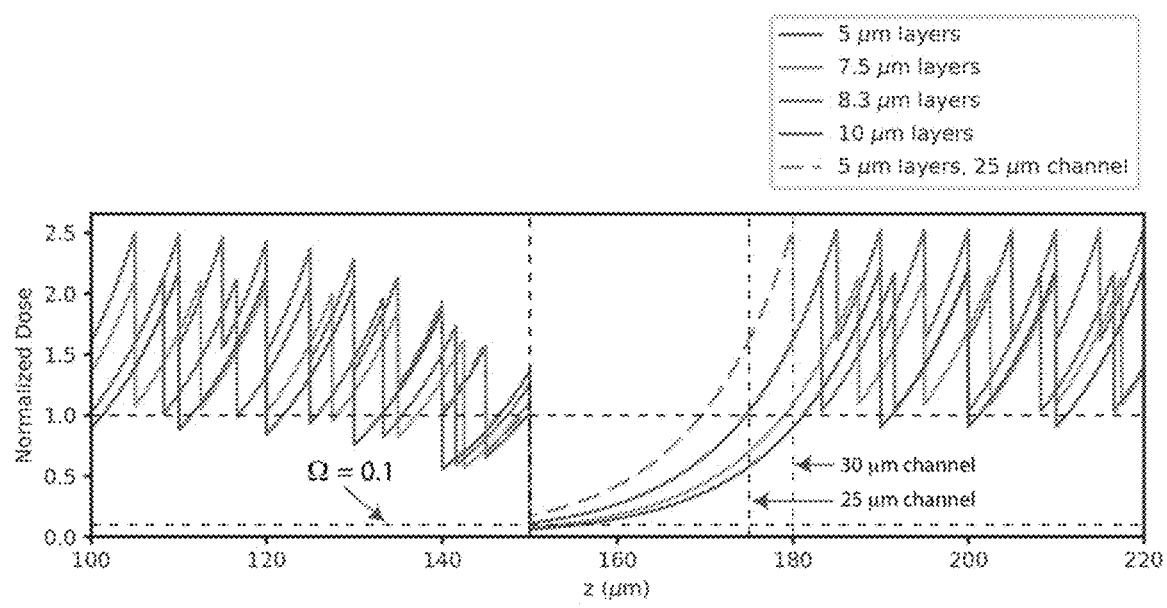
FIG. 4C Calculated dose as a function of depth for the cases in FIG. 4A.

FIG. 4C shows the calculated normalized dose for the actual experimental conditions of FIG. 4A. An additional example case is shown for a 25 µm channel made with 5 µm layers, which never successfully forms clear channels. It is representative of many other parameter combinations that also fail.

Experimentally, It is found that the minimum height channel for a given layer thickness fulfills the following conditions: (1) the normalized dose at the back of the channel, $\Omega_{c,b}$ is less than or equal to ~0.1 and (2) the dose at the front of the channel, $\Omega_{tot,b}$ is such that it decays to less than or equal to ~1 at a distance of $L_{min}$ above the bottom of the channel, where $L_{min}$ is given by $$L_{min} \approx -h_a \log(0.1) \quad (11)$$

$$= 2.3 h_a. \quad (12)$$

Careful examination of the first 4 cases shown in FIG. 4C shows that these conditions are fulfilled ($2.3h_a$, =25 μm for 2% NPS), whereas for the last case the second condition is not fulfilled ($\Omega$ is ~1.7 at 25 μm).

The smallest possible channel height is realized when the designed channel is 3 layers thick with a height $L_{min}$, in which case the normalized layer thickness, $\xi_l$, is $$\xi_1 = z_1/h_a \quad (13)$$

$$\approx 0.77. \quad (12)$$

Channels larger than this are possible with other layer thicknesses as long as conditions (1) and (2) are fulfilled.

To test whether this model is predictive, consider 3% NPS resin for which $h_a$=8 μm, in which case $$L_{min} = 2.3 h_a = 18 \text{ μm} \quad (15)$$

$$z_1 = L_{min}/3 = 6 \text{ μm} \quad (16)$$

$$\xi_1 = z_1/h_a = 0.75. \quad (17)$$

Figure 5A:
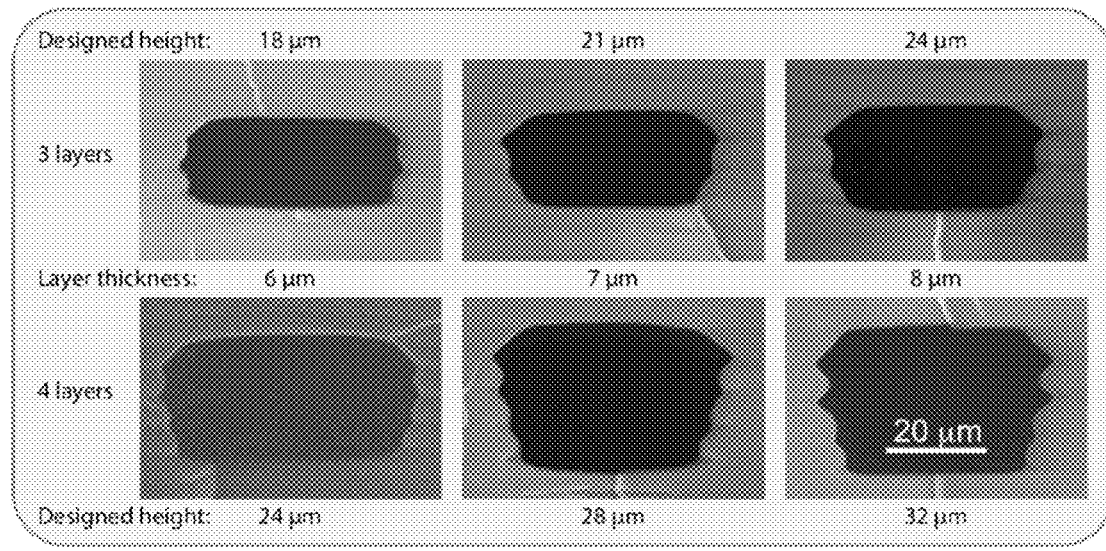
FIG. 5A Same as FIG. 4A except for 3% NPS.
Figure 5B:
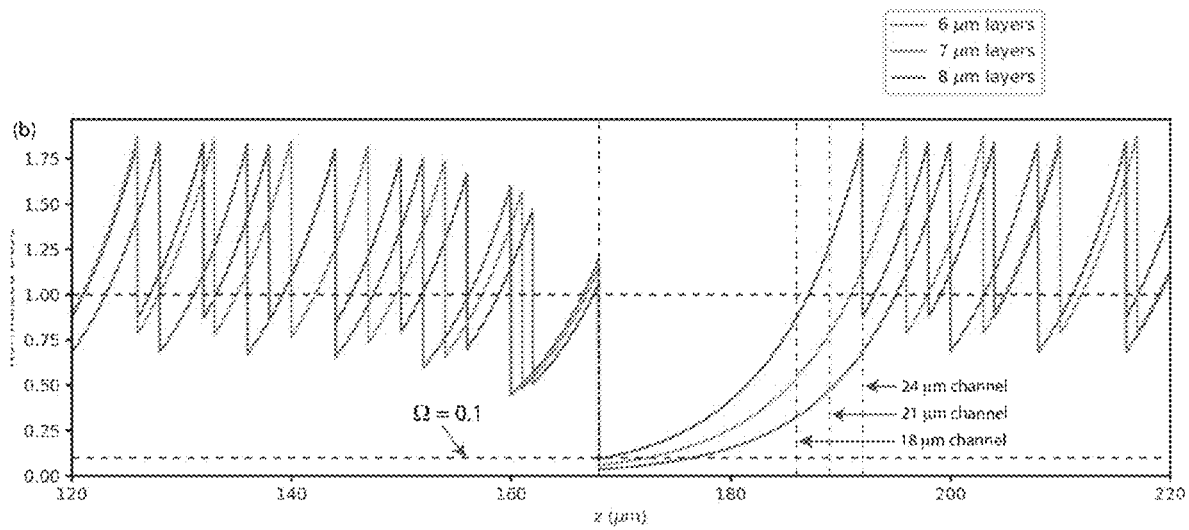

FIG. 5A shows the corresponding results where the 3 layer 18 μm channel is clearly open, as are 3 layer channels with 7 and 8 μm layers. The calculated normalized dose as a function of z in FIG. 5B clearly fulfills the model's conditions for all cases. As seen in the second row of SEM images in FIG. 5A, increasing the channel height by adding more layers always results in open channels.

3.3.2 Channel Width

The designed channel width for all of the cases presented so far is 4 pixels (30 μm). Consistent with results in Ref. 11, this was found to be the minimum channel width that gives 100% yield. However, the physical width of the channels in FIGS. 4A and 5A are wider than the designed width by the equivalent of 1 to 2 pixels. This can be explained by noting that the teflon film at the bottom of the resin tray is slightly cloudy. It therefore causes scattering of the light imaged through it, which broadens the effective exposure region of each pixel that is turned on. Lack of exposure for the pixels in the channel reduces the dose received at the edges of the channels to below the polymerization threshold.

Figure 6A:
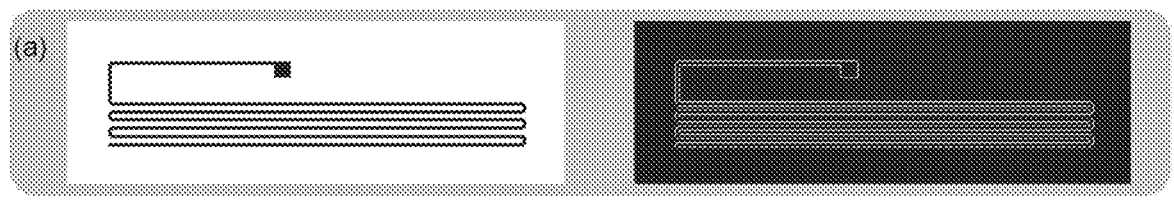
FIG. 6A Primary and additional edge exposure patterns for a single layer containing a flow channel.
Figure 6B:
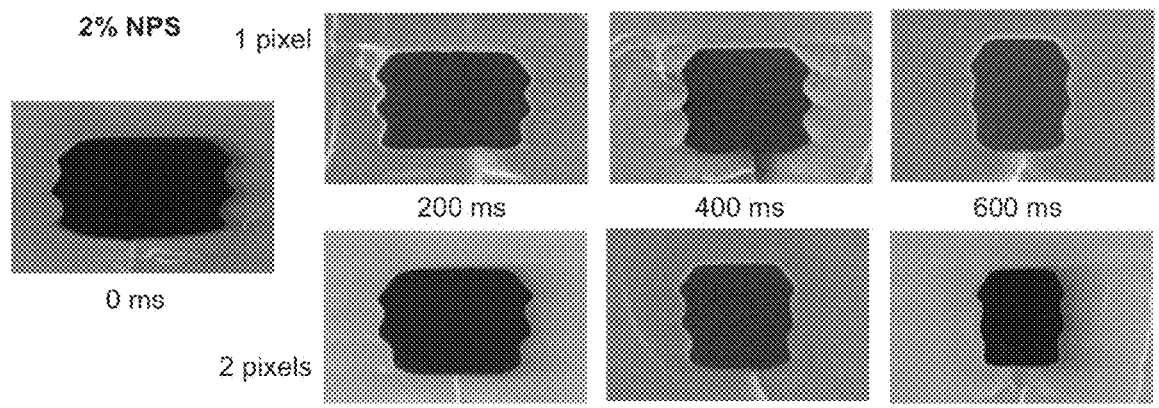
FIG. 6B Channel narrowing for 2% NPS resin for additional edge exposure. The build layer size is 8.3 μm layers and the designed flow channel height is 25 μm.
Figure 6C:
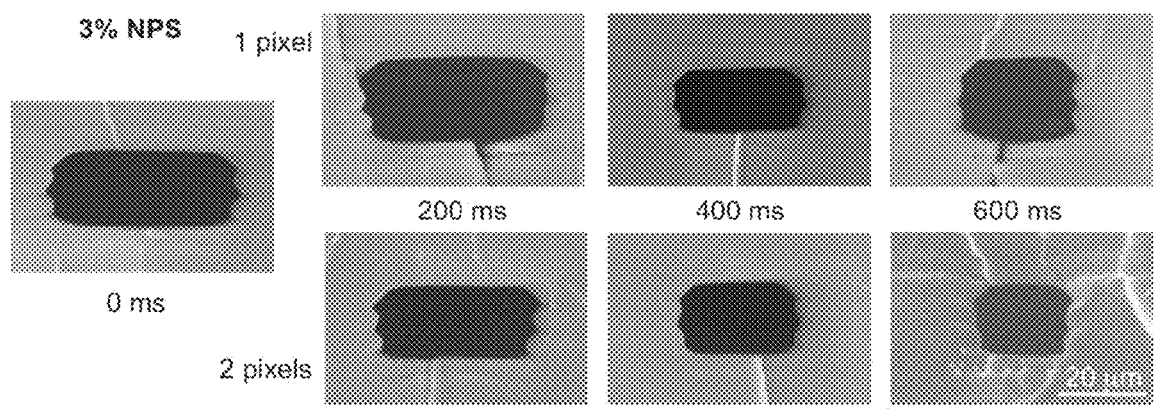
FIG. 6C Same as FIG. 6B except for 3% NPS resin with 6 μm layers and a designed flow channel height of 18 μm.
Figure 6D:
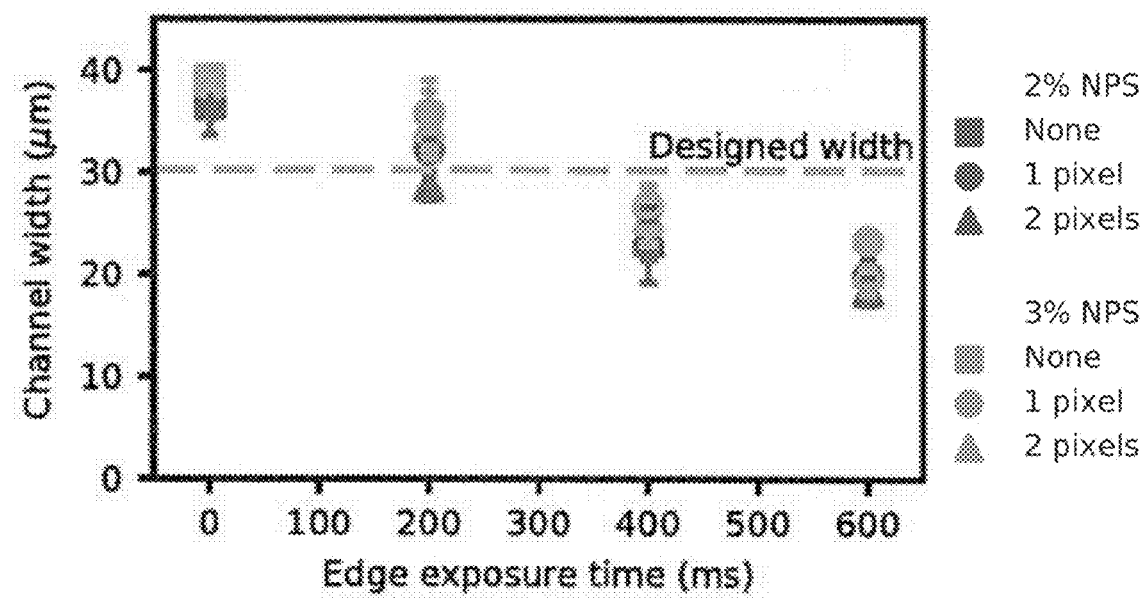
FIG. 6D Measured channel width as a function of edge exposure time.
Figure 6E:
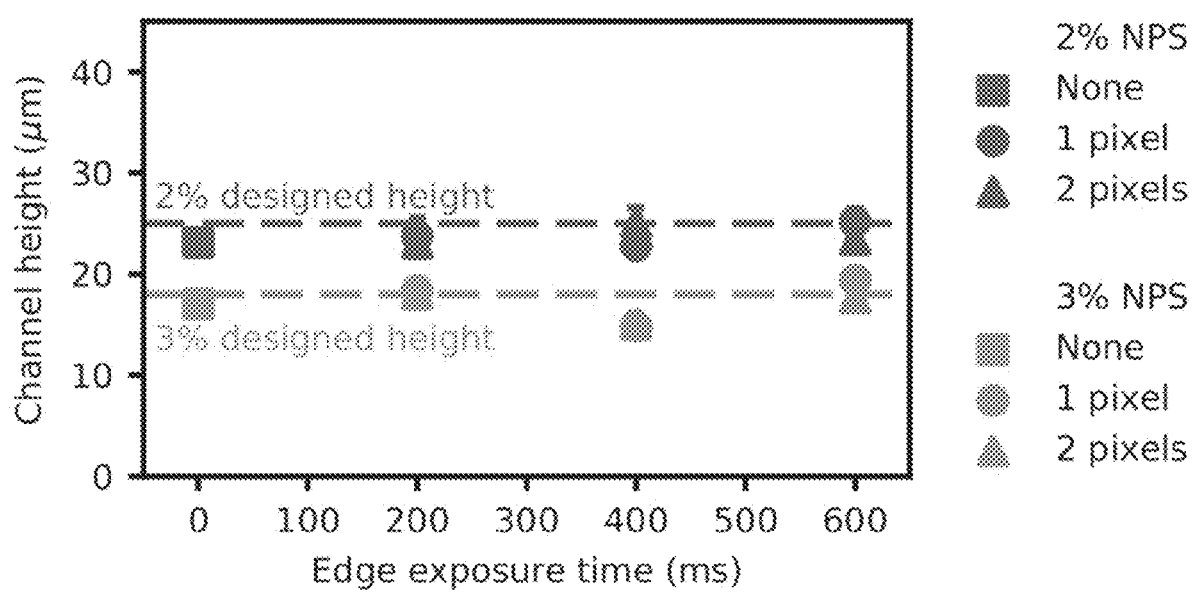
FIG. 6E Measured channel height as a function of edge exposure time.
Figure 7A:
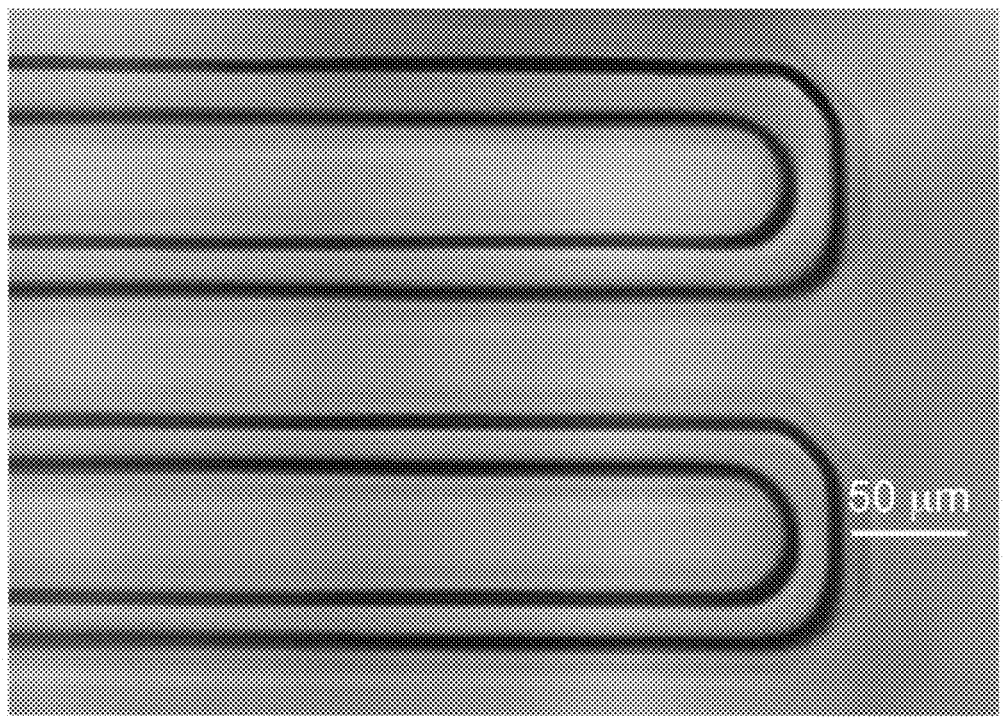
FIG. 7A Microscope photograph of single layer serpentine channel.
Figure 7B:
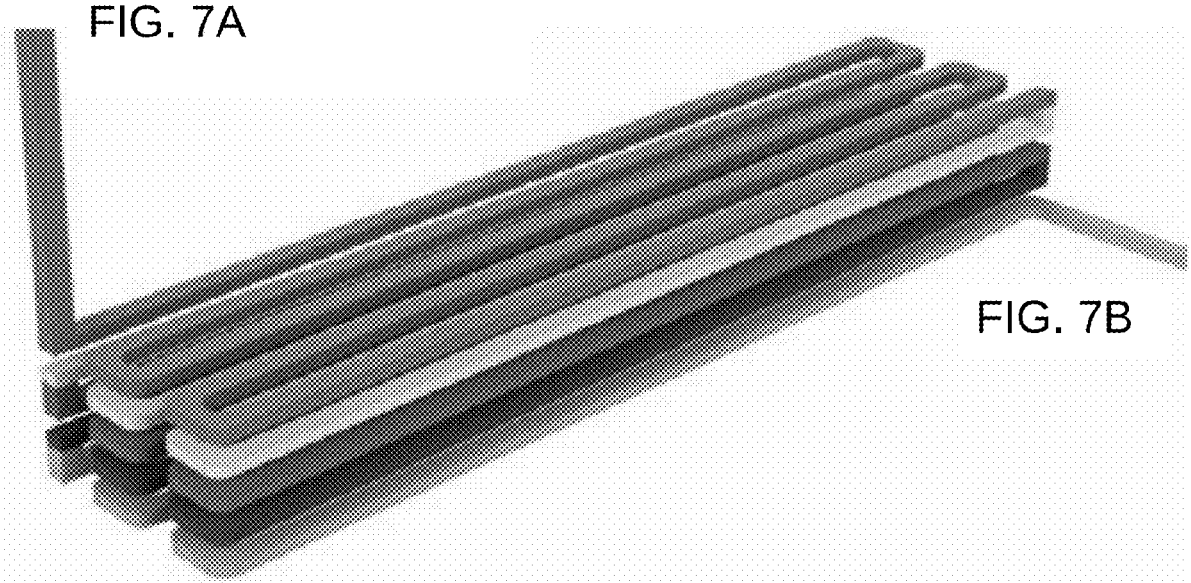
FIG. 7B Schematic illustration of 3D stacked serpentine channel design. Each layer is shown as a different color.
Figure 7C:
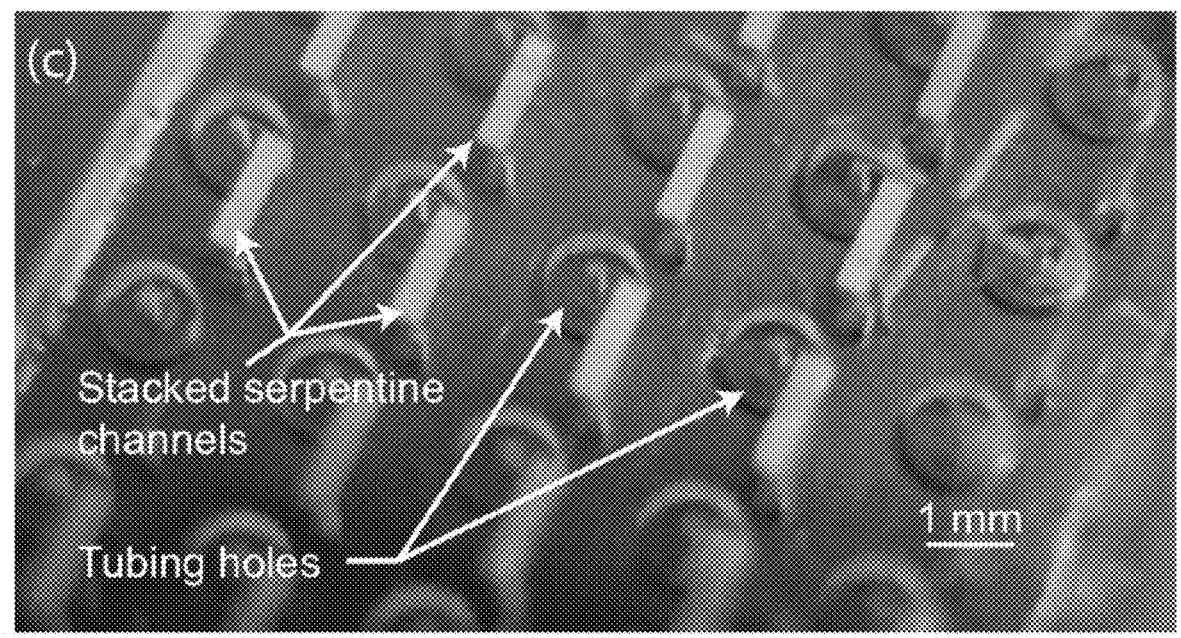
FIG. 7C Photograph of 3D printed device with 24 3D serpentine channels. The photo is taken through the glass slide on which the device is 3D printed.
Figure 7D:
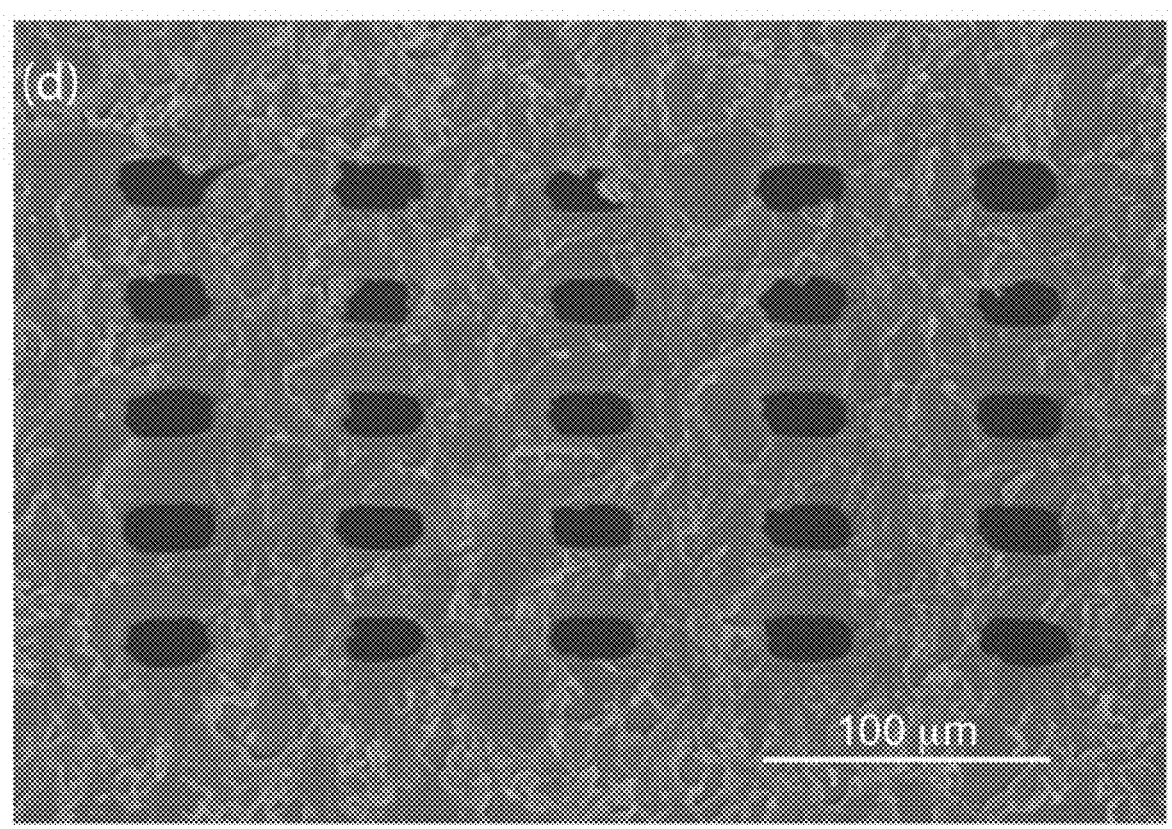
FIG. 7D SEM image of 3D serpentine channel cross section.

Developed was a channel narrowing method that compensates for this lack of sufficient dose at channel edges. The left image in FIG. 6A shows a typical primary exposure pattern for a single layer containing a flow channel where white and black regions correspond to full exposure and no exposure, respectively. The right image is a second exposure of the same layer where only the 1 or 2 pixels adjacent to the channel are exposed. FIGS. 6B and C show the effect of 1 and 2 pixel edge exposures for different exposure times for 2% and 3% NPS resin, respectively. This strategy is clearly very effective in narrowing the channel width, which is further illustrated in FIG. 6D where the measured channel width is plotted as a function of the edge exposure time. The width can be reduced from nearly 40 μm to 20 μm. As shown in FIG. 6E, the edge dose has no effect on the channel height (as expected). The final result is that 18 μm×20 μm channels can be consistently fabricated with 3% NPS resin.

3.4 Long Channels

As an illustration of the efficacy of the above approach, consider the fabrication of serpentine channels in FIG. 7 in 3% NPS resin with a 1 pixel 400 ms edge exposure. A microscope image of a single layer serpentine channel is shown in FIG. 7A. Note the excellent optical clarity of imaging through the microscope slide substrate into the interior of the 3D printed device. A 3D serpentine channel design is shown in FIG. 7B, with a photograph of a device containing 24 3D channels in FIG. 7C. An SEM cross section is shown in FIG. 7D. The channel is 41 mm long and occupies a volume of only 1.56 mm×0.38 mm×0.21 mm=0.12 mm³.

Figure 8:
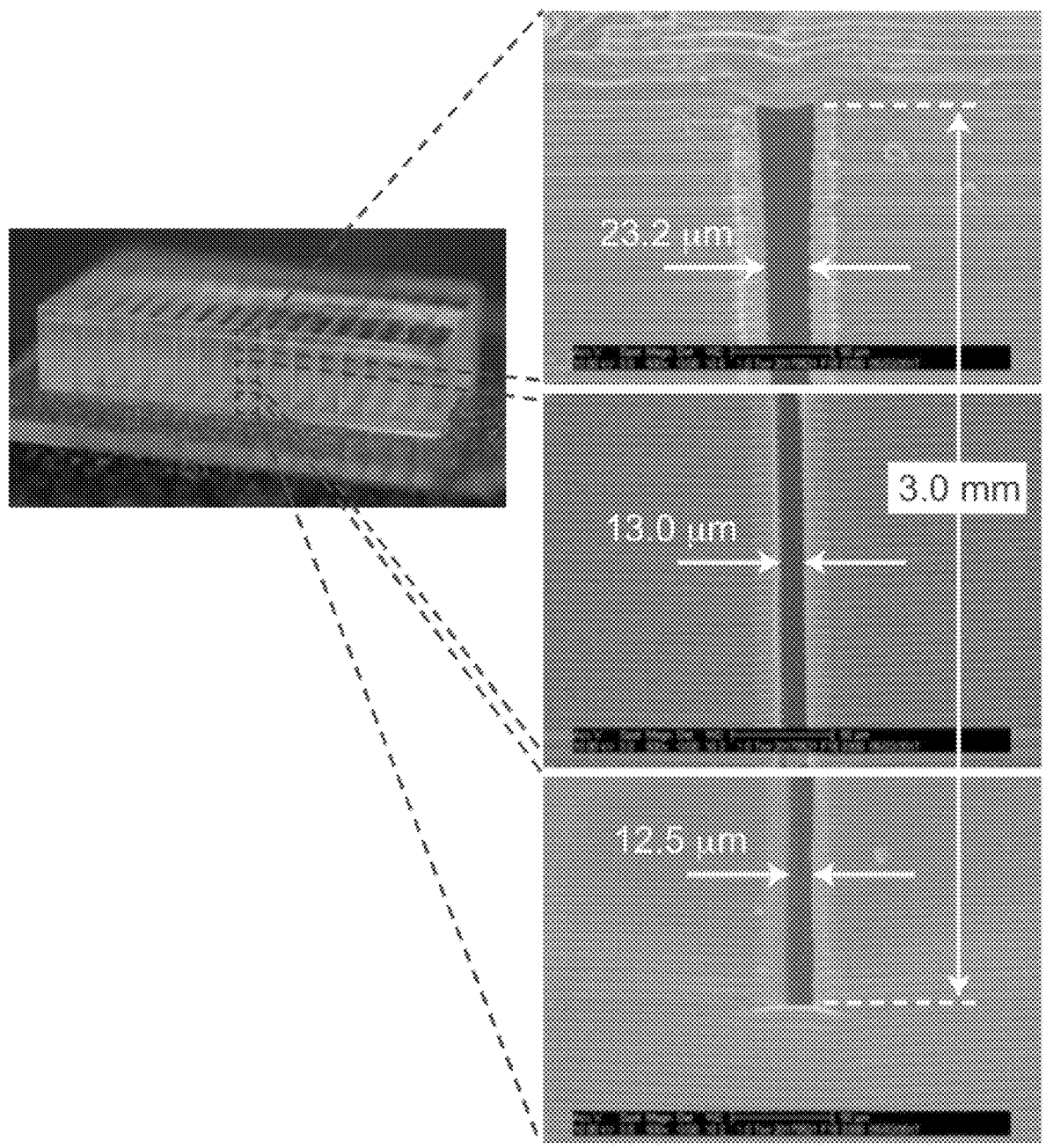
FIG. 8 Photograph and SEM images of 3D printed high aspect ratio flow channel.
Figure 9:
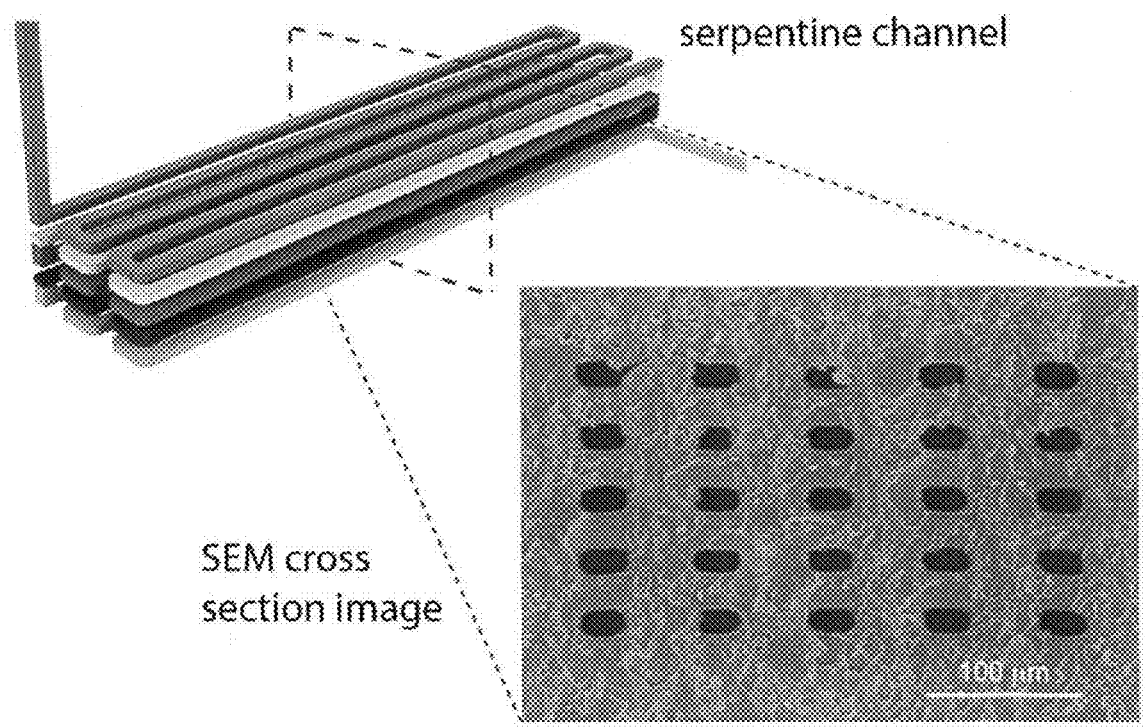
FIG. 9 Illustration of a serpentine channel and a SEM cross section image.

In FIG. 8 is an illustration of serpentine channel and a SEM cross section image.

3.5 Tall High Aspect Ratio Channel

As a further demonstration, consider the high aspect ratio channel shown in FIG. 8, fabricated with 5 μm layers, 4 pixels wide in 2% NPS with 2 pixel 400 ms edge exposure. Since one is not going for the minimum channel height, one can use a smaller layer thickness to decrease the sidewall surface relief that naturally occurs due to the layered nature of the 3D printing process. The channel width is ~13 μm for most of the channel height, which is 3 mm (its length is 12 mm). Such channels are useful in nanoscale liposome synthesis for drug delivery as discussed in Ref. 33.

4 Conclusions

In summary, It has been shown that DLP-SLA is fully capable of 3D printing truly microfluidic flow channels with designed cross sectional areas as small as 18 μm×20 μm. The out-of-plane void size is dependent on formulating a resin that adequately limits optical penetration during each layer exposure, which requires that the absorber's absorption spectrum fully cover the source spectrum. Small in-plane (x-y) void size is a function of the projected image resolution with a minimum width of 4 pixels. It has also been shown that an additional edge dose for each layer containing a flow channel is an effective method of narrowing flow channel width. Taken together, these advances open the door for 3D printing to displace conventional microfluidic fabrication methods such as soft lithography.

5 Supplementary Material 5.1 3D Printer

Figure 10A:
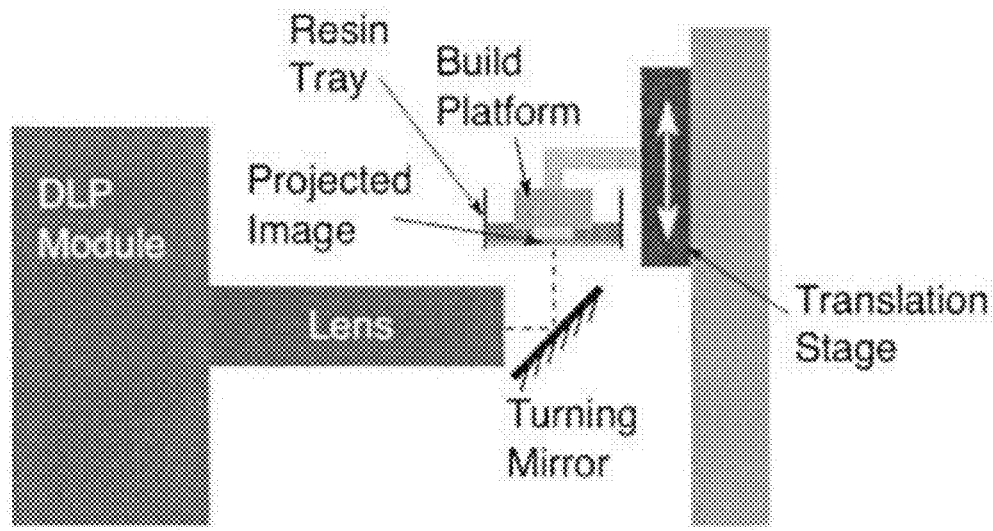
FIG. 10A Schematic illustration of 3D printer.
Figure 10B:
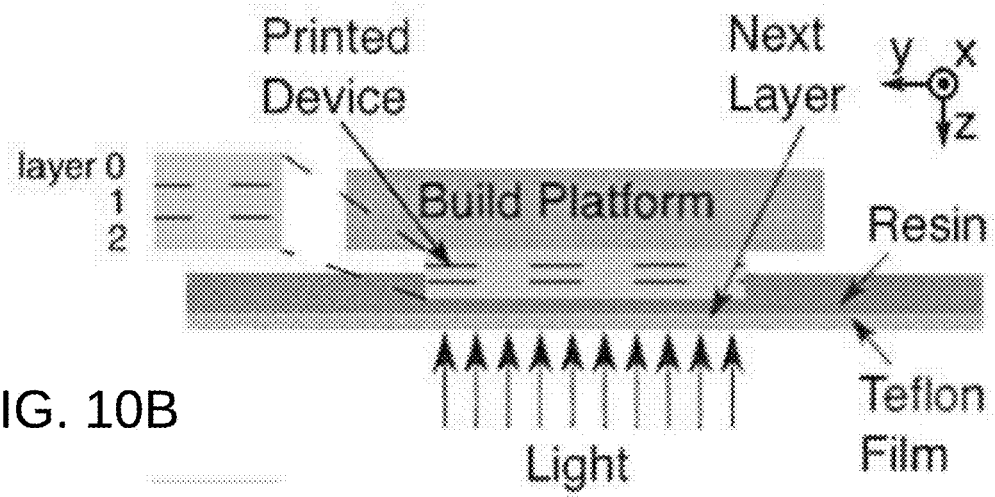
FIG. 10B, FIG. 10C, FIG. 10D, FIG. 10E Process to 3D print a device, illustrating the formation of a microfluidic flow channel (i.e., void region).
Figure 10C:
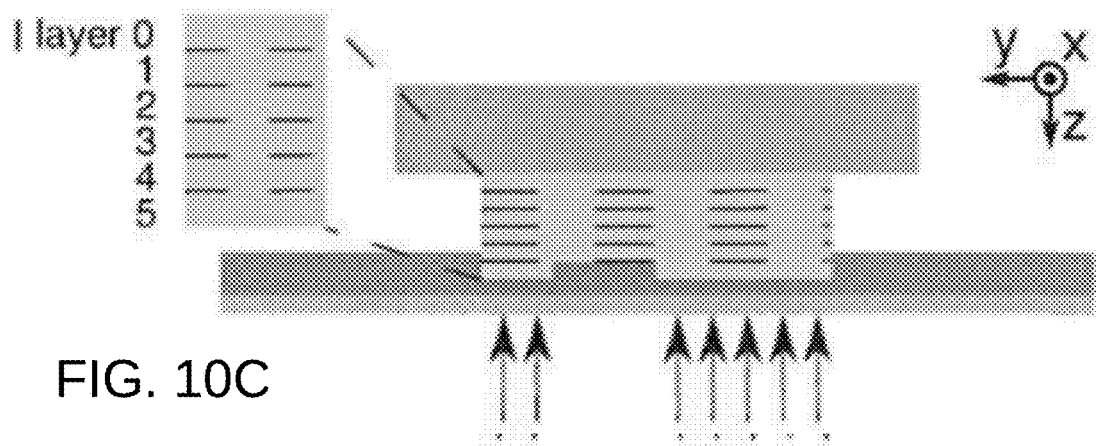
Figure 10D:
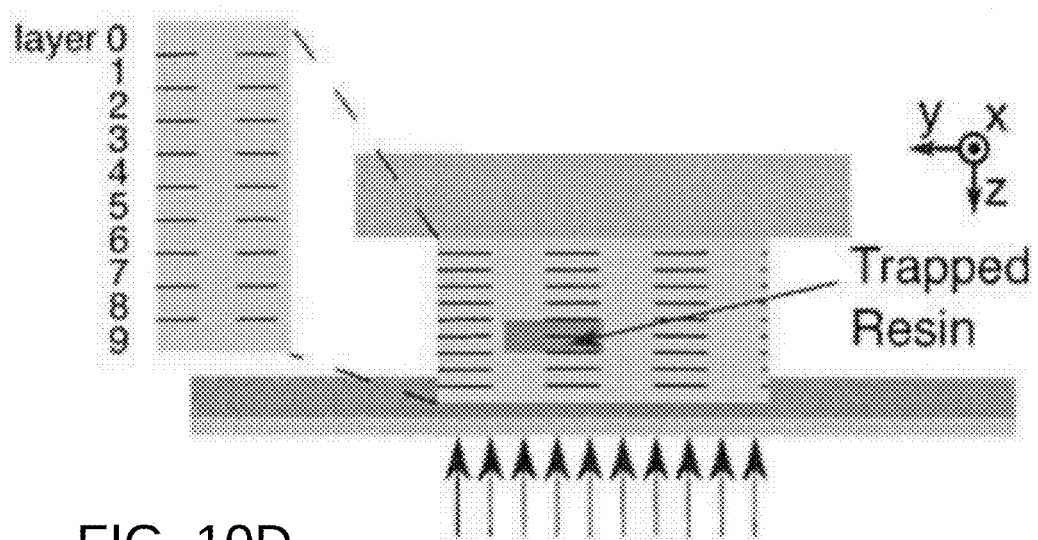
Figure 10E:
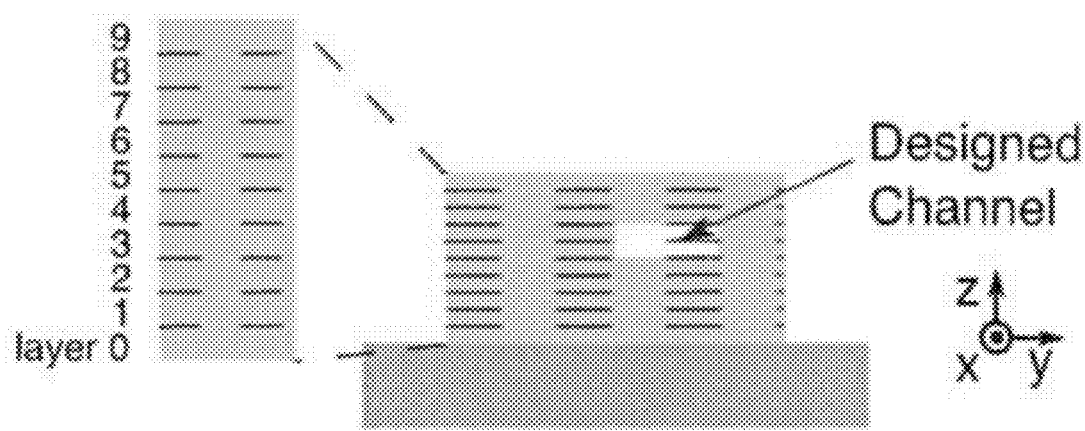

FIG. 10A shows a schematic illustration of the 3D printer and the spatial relationship between the various components. During operation (FIG. 10B-10E), a device is fabricated upside down with light incident through a transparent Teflon™ polytetrafluoroethylene film which comprises the bottom of the resin tray. Each layer is formed by raising the fluid layer, followed by lowering the build platform such that the last built layer is separated from the Teflon film by $z_1$, the build layer thickness. The uncured resin in this space is then photopolymerized in the desired pattern by exposure to an image projected by the DLP module, lens system, and turning mirror.

Some preliminary characterization was done using DEM measurements for 2% NPS resin of the actual build layer thicknesses achieved by the system compared to the design thicknesses of 5, 7.5, 8.3, and 10 μm. This analysis shows that the average measured build layer thickness is 7.6% smaller than the designed thickness with a standard deviation of 7.5%. A few initial measurements for this 3% NPS resin design thicknesses of 6 and 7 μm show measured thicknesses that are 12% smaller. While better build layer thickness fidelity can likely be achieved by replacing the stock Solus z-translation mechanism with one having higher performance, is was found the stock mechanism to be sufficient for the initial goals to achieve 18 μm×20 μm 3D printed flow channels.

5.2 Molecular Structures

In FIG. 11 molecular structures for monomer, photoinitiator, and UV absorbers used in this discussion (except for UV386A, which is proprietary).

TABLE 4

Compare monochromatic and polychromatic resin exposures

| Line | Parameter | Units | Symbol | Monochromatic Case | Polychromatic Case |
|---|---|---|---|---|---|
| 1 | Irradiance at z = 0 | W/cm$^2$ | $I_0$ | $I_0$ | $\int_0^\infty I_0(\lambda)d\lambda$ |
| 2 | Irradiance as a function of z | W/cm$^2$ | $I(z)$ | $I_0 e^{-\alpha z}$ | $\int_0^\infty I_0(\lambda)e^{-\alpha(\lambda)z}d\lambda$ |
| 3 | Dose as a function of z, t | J/cm$^2$ | $D(z,t)$ | $tI_0 e^{-\alpha z}$ | $t\int_0^\infty I_0(\lambda)e^{-\alpha(\lambda)z}d\lambda$ |
| 4 | Critical dose | J/cm$^2$ | $D_c$ | $t_p I_0 e^{-z_p/h_a}$ | $t_p \int_0^\infty I_0(\lambda)e^{-\alpha(\lambda)z_p}d\lambda$ |
| 5 | Time to reach critical dose at z = 0 | s | $T_c$ | $D_c/I_0$ | $D_c \Big/ \int_0^\infty I_0(\lambda)d\lambda$ |
| 6 | Polymerization depth | μm | $z_p$ | $h_a \ln\dfrac{t_p}{T_c}$ | see below |

5.3 Monochromatic and Polychromatic Resin Exposure Comparison

Table 4 summarizes the parameters that are important for monochromatic exposure of photopolymerizable resins as defined in Ref. 36. It also gives the corresponding expressions for polychromatic resin exposures so the two cases can be directly compared.

5.4 Derivation of Model 4

The critical dose, Dc, on Line 4 in Table 4 is the dose required to just polymerize a resin for a given irradiance. This dose occurs at the leading edge of the polymerization thickness, $z_p$, which corresponds to a specific polymerization time, $t_p$. For the monochromatic case it can solve Line 4 for the polymerization time (using Line 5) as:

$$\frac{t_p}{T_c} = e^{z_p/h_a}, \tag{S1}$$

which leads to Eq. 1 for $z_p$ in the main text (Model 3, which is also on Line 6). For the polychromatic case it cannot be obtained an analytic expression for the polymerization depth, $z_p$. Instead, $t_p$ must be solved. Beginning with Line 5, $$T_c = \frac{D_c}{\int_0^\infty I_0(\lambda)d\lambda}, \tag{S2}$$

and substituting for Dc (Line 4), obtained is $$\frac{T_c}{t_p} = \frac{\int_0^\infty I_0(\lambda)e^{-\alpha(\lambda)z_p}\,d\lambda}{\int_0^\infty I_0(\lambda)d\lambda} \tag{S3}$$

$$= D_n(z_p) \tag{S4}$$

$$\approx (1-a) + a\exp(-z_p/b) \tag{S5}$$

where $D_n(z)$ is the normalized dose defined in Eq. 3 and Eq. S5 is from Eq. 6 in the main text. Solving for $t_p$ is obtained $$t_p = \frac{T_c}{(1-a) + a\exp(-z_p/b)}, \tag{S6}$$

which is Model 4.

TABLE 5

Summary of fit parameters based on measured spectra and on measured thickness vs. exposure time data. All resins are formulated with 1% Irgacure 819 in addition to the specified absorber.

| | | | Fit from measured spectrum | | | Fit from measured thickness vs. exposure time | | | | |
|---|---|---|---|---|---|---|---|---|---|---|
| | | | Model 1 | Model 2 | | Model 3 | | Model 4 | | |
| Material | Solubility | Concentration | $h_a$ (μm) | a | b (μm) | $h_a$ (um) | $T_c$ (ms) | a | b (μm) | $T_c$ (ms) |
| Photoinitiator | | | | | | | | | | |
| Irgacure 819 | >5% | 1% | 218.85 | 0.98 | 208.47 | 196.13 | 89.42 | 1.00 | 193.40 | 88.21 |
| UV Absorbers | | | | | | | | | | |
| Avobenzone | >5% | 1% | 15.10 | 0.92 | 10.70 | 20.00 | 283.23 | 0.84 | 10.49 | 258.93 |
| Benetex OB+ | 0.25% | 0.25% | 19.15 | 0.97 | 17.50 | 24.47 | 56.37 | 0.98 | 21.65 | 55.95 |

TABLE 5-continued

Summary of fit parameters based on measured spectra and on measured thickness vs. exposure time data. All resins are formulated with 1% Irgacure 819 in addition to the specified absorber.

| | | | Fit from measured spectrum | | | | Fit from measured thickness vs. exposure time | | | |
|---|---|---|---|---|---|---|---|---|---|---|
| | | | Model 1 | Model 2 | | Model 3 | | Model 4 | | |
| Material | Solubility | Concentration | $h_a$ (μm) | a | b (μm) | $h_a$ (um) | $T_c$ (ms) | a | b (μm) | $T_c$ (ms) |
| BLS 99-2 | >5% | 2% | 57.28 | 0.97 | 50.65 | 72.49 | 202.13 | 0.92 | 51.30 | 181.92 |
| Coumarin 102 | 0.8% | 0.5% | 11.98 | 0.97 | 11.03 | 19.55 | 123.59 | 0.95 | 12.00 | 90.90 |
| Martius Yellow | 3% | 1% | 15.26 | 0.98 | 14.34 | 13.28 | 448.69 | 1.00 | 13.03 | 423.74 |
| NPS | >5% | 2% | 11.74 | 0.98 | 11.17 | 11.18 | 307.33 | 1.00 | 10.88 | 280.44 |
| NPS | | 3% | 8.28 | 0.99 | 7.94 | 8.05 | 413.72 | 1.00 | 8.16 | 427.58 |
| Octocrylene | >5% | 1% | 194.96 | 0.98 | 184.13 | 173.84 | 95.75 | 1.00 | 173.00 | 95.27 |
| Phenazine | 1.8% | 0.5% | 33.47 | 0.97 | 30.30 | 23.03 | 1005.38 | 0.96 | 19.51 | 936.94 |
| Quercetin | 0.8% | 0.5% | 16.16 | 0.96 | 14.12 | 12.03 | 324.96 | 1.00 | 12.18 | 333.04 |
| Salicylaldehyde | >5% | 2% | 175.21 | 0.98 | 166.75 | 162.94 | 90.05 | 1.00 | 164.19 | 90.58 |
| Sudan I | 2.7% | 0.6% | 18.08 | 1.00 | 17.99 | 16.92 | 335.62 | 1.00 | 14.95 | 227.14 |
| UVS-1101 | 0.5% | 0.5% | 31.20 | 0.98 | 28.92 | 34.03 | 105.75 | 0.96 | 24.11 | 78.80 |

5-5 Fits to Models 1-4

As seen in Table 5, absorbers with good spectral overlap with the source spectrum as observed in FIG. 3A have fits to Model 2 in which a≈1. In this case Model 2 reduces to Model 1 and the corresponding fits for b and $h_a$ are in reasonable agreement. Likewise, when Models 3 and 4 are fit to experimental thickness versus exposure data, good spectral overlap corresponds to a=1 in Model 4 such that Model 4 reduces to Model 3 and b and $h_a$ are fairly consistent with not only each other, but also with b and ha obtained solely from the measured molar absorptivity in Models 1 and 2. An important ramification is that for absorbers with good spectral overlap with the source it is unnecessary to experimentally measure the thickness as a function of exposure to determine ha. Instead, ha can be found by using it as a fitting parameter in Eq. 7 in the main text where the absorption coefficient in $D_n(z)$ is $$\alpha(z) = \alpha_{abs}(\lambda) + \alpha_{pi}(\lambda) \tag{S7}$$

where $\alpha_{abs}(\lambda)$ and $\alpha_{pi}(\lambda)$ are the absorber and photoinitiator absorption coefficients, respectively, calculated from their molar absorptivities.

TABLE OF REFERENCES FOR PART I
"CUSTOM 3D PRINTER AND RESIN FOR MICROFLUIDIC FLOW CHANNELS"

1. A. K. Au, W. Huynh, L. F. Horowitz and A. Folch, Angew. Chem., 2016, 128, 3926-3946.
2. Y. He, Y. Wu, J.-z. Fu, Q. Gao and J.-j. Qiu, Electroanalysis, 2016, 28, 1658-1678.
3. R. Amin, S. Knowlton, A. Hart, B. Yenilmez, F. Ghaderinezhad, S. Katebifar, M. Messina, A. Khademhosseini and S. Tasoglu, Biofabrication, 2016, 8, 022001.
4. N. Bhattacharjee, A. Urrios, S. Kang and A. Folch, Lab on a Chip, 2016, 16, 1720-1742.
5. S. Waheed, J. M. Cabot, N. P. Macdonald, T. Lewis, R. M. Guijt, B. Paull and M. C. Breadmore, Lab on a Chip, 2016, 16, 1993-2013.
6. C. Chen, B. T. Mehl, A. S. Munshi, A. D. Townsend, D. M. Spence and R. S. Martin, Analytical Methods, 2016, 8, 6005-6012.
7. A. A. Yazdi, A. Popma, W. Wong, T. Nguyen, Y. Pan and J. Xu Microfluidics and Nanofluidics, 2016, 20, 1-18.
8. C. M. B. Ho, S. H. Ng, K. H. H. Liand Y.-J. Yoon, LabChip, 2015, 15, 3627-3637.
9. Y. Huang, M. C. Leu, J. Mazumder and A. Donmez, Journal of Manufacturing Science and Engineering, 2015, 137, 014001.
10. B. C. Gross, J. L. Erkal, S. Y. Lockwood, C. Chen and D. M. Spence, Anal. Chem., 2014, 86, 3240-3253.
11. H. Gong, M. Beauchamp, S. Perry, A. T. Woolley and G. P. Nordin, RSC Adv., 2015, 5, 106621-106632.
12. M. J. Beauchamp, G. P. Nordin and A. T. Woolley, Analytical and Bioanalytical Chemistry, 2017. doi: 10.1007/s00216-017-0398-3.
13. R. D. Sochol, E. Sweet, C. C. Glick, S. Venkatesh, A. Avetisyan, K. F. Ekman, A. Raulinaitis, A. Tsai, A. Wienkers, K. Korner, K. Hanson, A. Long, B. J. Hightower, G. Slatton, D. C. Burnett, T. L. Massey, K. Iwai, L. P. Lee, K. S. J. Pister and L. Lin, Lab Chip, 2016, 16, 668-678.
14. R. Walczak and K. Adamski, Journal of Micromechanics and Microengineering, 2015, 25, 085013.
15. Y. Ukita, Y. Takamura and Y. Utsumi, Japanese Journal of Applied Physics, 2016, 55, 06GN02.
16. A. I. Shallan, P. Smejkal, M. Corban, R. M. Guijt and M. C. Breadmore, Anal. Chem., 2014, 86, 3124-3130.
17. J. M. Lee, M. Zhang and W. Y. Yeong, Microfluidics and Nanofluidics, 2016, 20, 5.
18. L. Donvito, L. Galluccio, A. Lombardo, G. Morabito, A. Nicolosi and M. Reno, Journal of Micromechanics and Microengineering, 2015, 25, 035013.
19. C. I. Rogers, K. Qaderi, A. T. Woolley and G. P. Nordin, Biomicrofluidics, 2015, 9, 1-9.
20. N. P. Macdonald, J. M. Cabot, P. Smejkal, R. M. Guijt, B. Paull and M. C. Breadmore, Analytical Chemistry, 2017, 89, 3858-3866.
21. K. G. Lee, K. J. Park, S. Seok, S. Shin, J. Y. Park, Y. S. Heo, S. J. Lee, T. J. Lee et al., RSC Advances, 2014, 4, 32876-32880.
22. K. B. Anderson, S. Y. Lockwood, R. S. Martin and D. M. Spence, Analytical chemistry, 2013, 85, 5622-5626.
23. P. S. Venkateswaran, A. Sharma, S. Dubey, A. Agarwal and S. Goel, IEEE Sensors Journal, 2016, 16, 3000-3007.
24. H. N. Chan, Y. Shu, B. Xiong, Y. Chen, Y. Chen, Q. Tian, S. A. Michael, B. Shen and H. Wu, ACS Sensors, 2015, 1, 227-234.

25. A. Urrios, C. Parra-Cabrera, N. Bhattacharjee, A. M. Gonzalez-Suarez, L. G. Rigat-Brugarolas, U. Nallapatti, J. Samitier, C. A. DeForest, F. Posas, J. L. Garcia-Cordero et al., Lab on a Chip, 2016, 16, 2287-2294.
26. G. W. Bishop, J. E. Satterwhite-Warden, I. Bist, E. Chen and J. F. Rusling, ACS sensors, 2015, 1, 197-202.
27. K. C. Bhargava, B. Thompson and N. Malmstadt, Proceedings of the National Academy of Sciences, 2014, 111, 15013-15018.
28. W. G. Patrick, A. A. Nielsen, S. J. Keating, T. J. Levy, C.-W. Wang, J. J. Rivera, O. MondragOn-Palomino, P. A. Carr, C. A. Voigt, N. Oxman et al., PloS one, 2015, 10, e0143636.
29. J. M. Zhang, E. Q. Li, A. A. Aguirre-Pablo and S. T. Thoroddsen, RSC Advances, 2016, 6, 2793-2799.
30 A. J. Morgan, L. H. San Jose, W. D. Jamieson, J. M. Wymant, B. Song, P. Stephens, D. A. Barrow and O. K. Castell, PloS one, 2016, 11, e0152023.
31 H. Gong, A. T. Woolley and G. P. Nordin, LabonaChip, 2016 16, 2450-2458. 32 L. Láng, Absorption Spectra in the Ultraviolet and Visible Region, Academic Press, 1961.
33 R. R. Hood and D. L. DeVoe, small, 2015, 11, 5790-5799.
32 L. Láng, Absorption Spectra in the Ultraviolet and Visible Region, Academic Press, 1961
33 R. R. Hood and D. L. DeVoe, small, 2015, 11, 5790-5799.
34 H. Gong, M. Beauchamp, S. Perry, A. T. Woolley and G. P. Nordin, RSC Adv., 2015, 5, 106621-106632.

Detailed Description—Part II

"3D Printed High Density, Reversible, Chip-to-Chip Microfluidic Interconnects"

1 Introduction

Recent work has focused on developing materials, tooling, and methods to enable 3D printing to successfully fabricate microfluidic devices with features in the truly microfluidic, as opposed to millifluidic, regime[1] for both passive and active components.[2-4] For example, recently developed is a custom Digital Light Processing stereolithographic (DLP-SLA) 3D printer and associated photopolymerizable resin with which was demonstrated reliable 3D printing of flow channels with cross sections as small as 18 μm×20 μm.[4] It has also been demonstrated that custom resin and commercial 3D printer work (60 μm×108 μm cross section flow channels)[2] enables a dense 3D layout of devices that includes integrated valves and pumps.[3] The later 3D printer and resin system are now applied to realize even smaller valves and pumps, in which is seen a 30× reduction in valve volume compared to earlier work. The expectation is that fully using all 3 spatial dimensions for component layout in conjunction with herein described new materials and methods will routinely result in 3D printed microfluidic devices with volumes on the order of 10 mm$^3$ or less. With such small sizes (only a few mm on a side), it is anticipated that many devices (tens to ~100) can be simultaneously printed in a single one hour 3D print run, thereby launching the possibility of using 3D printing for not only device prototyping but also device manufacturing. This would have a profound impact on the microfluidics development process by eliminating the current gap between prototyping and manufacturing, which typically rely on entirely different processes and materials resulting in two independent and expensive development cycles, and instead consolidate them to use the same tools and materials.

A critical aspect of realizing this vision is being able to make 10s to possibly 100s of interconnections to such small chips in order to provide the necessary fluid and pneumatic i/o values. However, current world-to-chip interconnect methods achieve an areal density of at best 1 mm$^{-2}$,[5-15] and are therefore unsuitable for this purpose. In this disclosure it is proposed that the world-to-chip interface be delegated to a separate, larger interface chip that in turn is connected through a new high density chip-to-chip interconnect to a much smaller device chip. The interface chip would be reusable with a sequence of disposable small device chips and could itself be 3D printed. The interface chip could either be designed to be specific for a particular type of device chip, or it could be implemented as a more universal interface for a variety of device chips. In either case, it could implement one of a number of world-to-chip interfaces (see for example a recent review in ref. 16 that has some possible interfaces), together with the new high density interconnects herein disclosed in order to form a bridge between lab-scale support equipment and small-volume, highly integrated 3D printed chips, which in turn lend themselves to mass manufacturing with 3D printing.

The chip-to-chip interconnect method herein described in this disclosure is designed to meet the following criteria: (1) support large numbers of interconnects at (2) high density (10 s per mm$^2$) while (3) withstanding pneumatic and fluid pressures typical for 3D printed microfluidic valves and pumps (at least 20 psi) and that are (4) reusable and (5) easy to align and connect. It is shown that these objectives can be achieved with an integrated microgasket (SIM) that is directly 3D printed as part of a device chip. Moreover, it is shown that a more refined controlled-compression integrated microgasket (CCIM) can be directly integrated with no increase in fabrication time or complexity because of the ease of 3D printing. In both cases, it is demonstrated 11×11 arrays of interconnects in an area of 1.5×1.5 mm$^2$ (53 interconnects per mm$^2$) that withstand 100 separations and reconnections with no degradation in performance for an applied pressure of up to 50 psi. It is then investigated the scaling properties of CCIMs by demonstrating a 20×20 array of interconnects in an area of 3.0×3.0 mm$^2$ and by showing that the areal density can be increased to 88 interconnects per mm$^2$. In short, using this approach, large numbers of high density chip-to-chip interconnects can be readily formed as part of a 3D printed microfluidic device (including alignment structures) with no requirement for additional materials or separately fabricated parts, thereby facilitating the vision outlined above.[17]

Finally, to illustrate the utility of CCIM interconnects to accommodate a large number of world-to-chip connections, a spatially distributed set of discrete CCIMs is used as part of testing a new, miniaturized 3D printed pneumatic membrane valves that are only 300 μm in diameter. Demonstrated are 28 world-to-chip connections in an interface chip with 28 chip-to-chip CCIMs for lifetime testing of 45 valves arranged in a 9×5 array in a device chip.

2 Materials and Methods 2.1 3D Printer and Materials

The 3D printer used in this example is the custom 3D printer described in ref. 4 and above with a 385 nm LED light source and a pixel pitch of 7.6 μm in the plane of the projected image. The photopolymerizable resin is the poly (ethylene glycol) diacrylate (PEGDA, MW258) resin with a 1% (w/w) phenylbisl(2,4,6-trimethylbenzoyl)phosphine oxide (Irgacure 819) photoinitiator and a 2% (w/w) 2-nitrophenyl phenyl sulfide (NPS) UV absorber described, which also details the suppliers used for these materials.

2.2 3D Printing 3D prints are fabricated on diced and silanized glass slides.[4] Each slide is prepared by cleaning with acetone and isopropyl alcohol (IPA), followed by immersion in 10% 3-(trimethoxysilyl)propyl methacrylate in toluene for 2 hours. After silane deposition, the slides are kept in toluene until use. The build layer thickness is 10 μm, and each build layer is exposed to a measured optical irradiance of 21.2 mW cm$^{-2}$ in the image plane. Unless otherwise noted, the layer exposure time is 600 ms. After printing, unpolymerized resin in interior regions is gently flushed with IPA, followed by device UV curing in an inexpensive consumer UV nail curer (54 Watt Professional UV Nail Dryer, Royal Nails) that emits a broad spectrum.[4]

2.3 Surface Roughness Measurement

Surface roughness measurements are made with a 3D printed rectangular block comprising 4 adjacent equal-area regions, each of which has a different layer exposure time (600, 800, 1000, and 1200 ms). After fabrication, the surface roughness is measured in three different ~0.1 mm$^2$ areas in each exposure region and the average root-mean-square (RMS) roughness is calculated based on these measurements. Measurements are made with a Zeta-20 3D optical profiler (Zeta Instruments, San Jose, Calif.) using a 10× objective lens.

2.4 Pressure and Reusability Measurements

For pressure testing, an interface chip and a test chip are aligned and clamped together with a custom aluminum clamp, as shown in FIGS. 12A and 12B. The test chip and interface chip are first fitted together using the matching 3D printed alignment features on each chip. The chips are then placed between machined aluminum pieces that have central cut-outs to facilitate optical access to the test and interface chips. O-rings are used on the interior lips of the aluminum pieces to avoid direct contact between the metal and glass slides on which the chips are 3D printed. The only tool required is a hex key which is used to gently (using two fingers) torque the four screws that hold the aluminum pieces together.

To test the performance of a single microgasket, a syringe pump is used to pressurize a given interconnect through its specific chip-to-world interface, as shown in FIG. 12C. Pressure is monitored with an electronic pressure transducer as the syringe pump pushes deionized (DI) water into the test chip at a flow rate of 50 μL min$^{-1}$. Any compromise in the seal integrity of the microgasket manifests itself as a drop in pressure, which is readily measured with the pressure transducer.

The same basic process is used to test the 11×11 interconnection arrays in sections 3.2 and 3.3 except that a parallel technique is applied in which 120 (out of 121) interconnects on the interface chip are routed to a single PTFE tube such that they can all be pressurized simultaneously using a syringe pump (see ref. 3 for details on PTFE tubing and the attachment method). If there is any leakage between the microgaskets and the interface chip, the pressure is released through the 121st interconnect, which is deliberately fabricated with an incomplete microgasket and which is connected to a second PTFE tube. Microgasket leakage, therefore, manifests itself as not only a drop in pressure but also the appearance of DI water in the second PTFE tube. To test the reusability of the interconnections between the interface and test chips, the clamp mechanism and the interface and test chips for the 11×11 interconnection arrays in sections 3.2 and 3.3 are disassembled after a pressure test, followed by re-assembly and another pressure test. This is repeated 100 times.

3 Results and Discussion

3.1 Concept

Figure 13A:
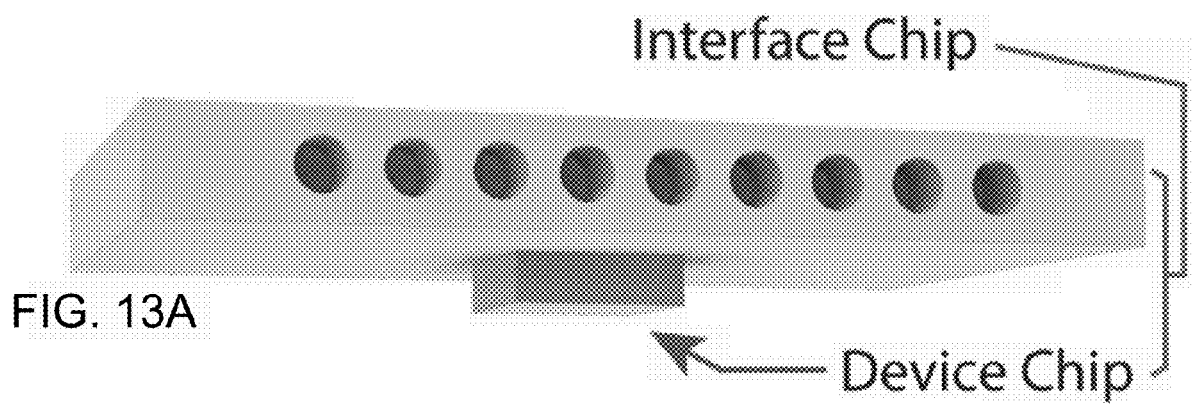
FIG. 13A Schematic illustration of a 3.4×3.4×1 mm$^3$ device chip connected to an interface chip (clamping mechanism not shown). The interface chip supplies a world-to-chip interface with an array of cylindrical recesses into which PTFE tubing is epoxied.

The basic idea of using an interface chip to act as a chip-to-world intermediary for a small device chip is shown in FIG. 13A, where, as an example, 9 cylindrical recesses for PTFE tubing are shown as the world interface on one edge of the chip, and on the bottom of the chip is a small 3×3 array of vertical channels (FIGS. 13B and 13C) that interface with a matching set of channels on the device chip.

Figure 13B:
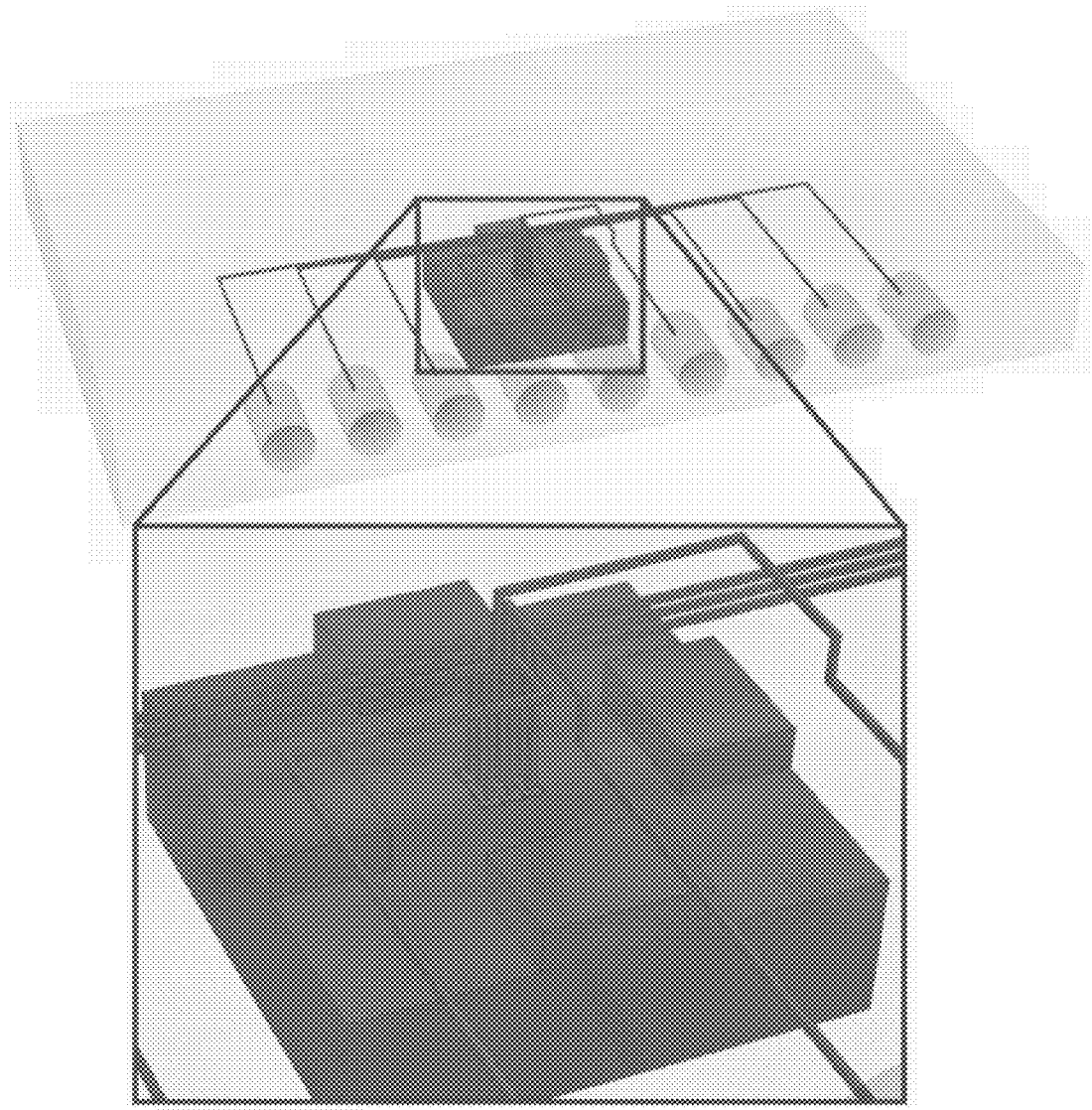
FIG. 13B Schematic illustration of the interior of the interface chip showing how channels are routed from the cylindrical recesses to an array of interconnects on the device chip. Alignment blocks on the top of the device chip are also visible.
Figure 13C:
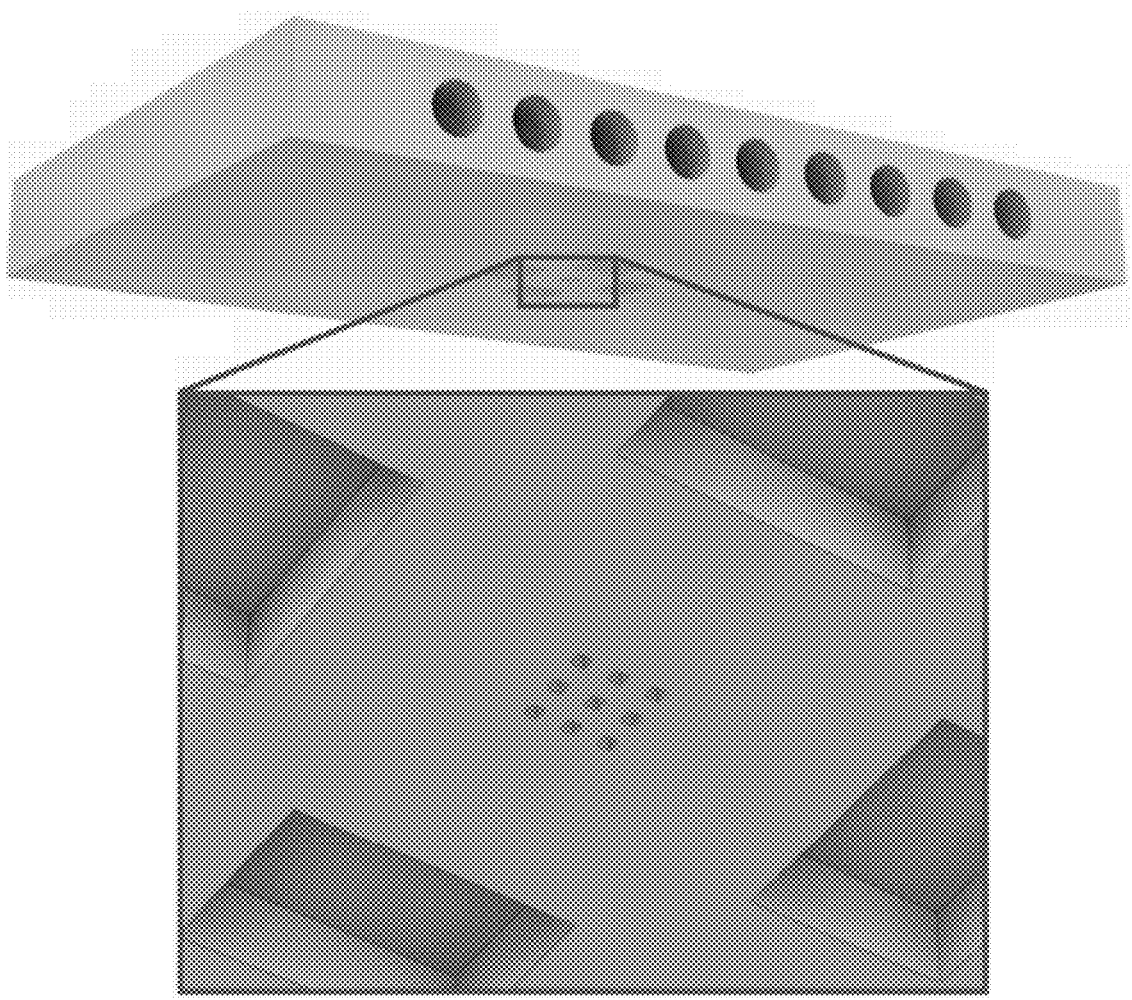
FIG. 13C Underside of the interface chip. The close-up shows that the interconnects consist of an array of flow channels that terminate on the flat bottom surface of the chip, and that the device chip alignment blocks fit into the recesses on the interface chip FIG. 14 Measured average surface roughness as a function of layer exposure time. The error bars indicate the standard deviation of the three measurements for each exposure time that are described in sect. 2.3. Inset: Microscope photo of the device with adjacent regions having 600 and 800 ms layer exposure times. Faint pixilation is more observable for the former than the latter.

Alignment of the two chips is achieved with four rectangular recesses in the bottom of the interface chip (FIG. 13C) into which fit matching rectangular blocks on the device chip (FIG. 13B). Typically the width of the rectangular blocks is designed to be 2 pixels wider than the recesses to account for slight material shrinkage and to ensure a snug fit. With this approach, one generally sees an alignment accuracy of approximately one pixel between the vertical channels on the interface and device chips. Also, the recesses are designed to be deeper than the height of the blocks so that the lower surface of the interface chip comes into contact with the upper surface of the device chip when they are clamped together as in FIG. 12.

Figure 14:
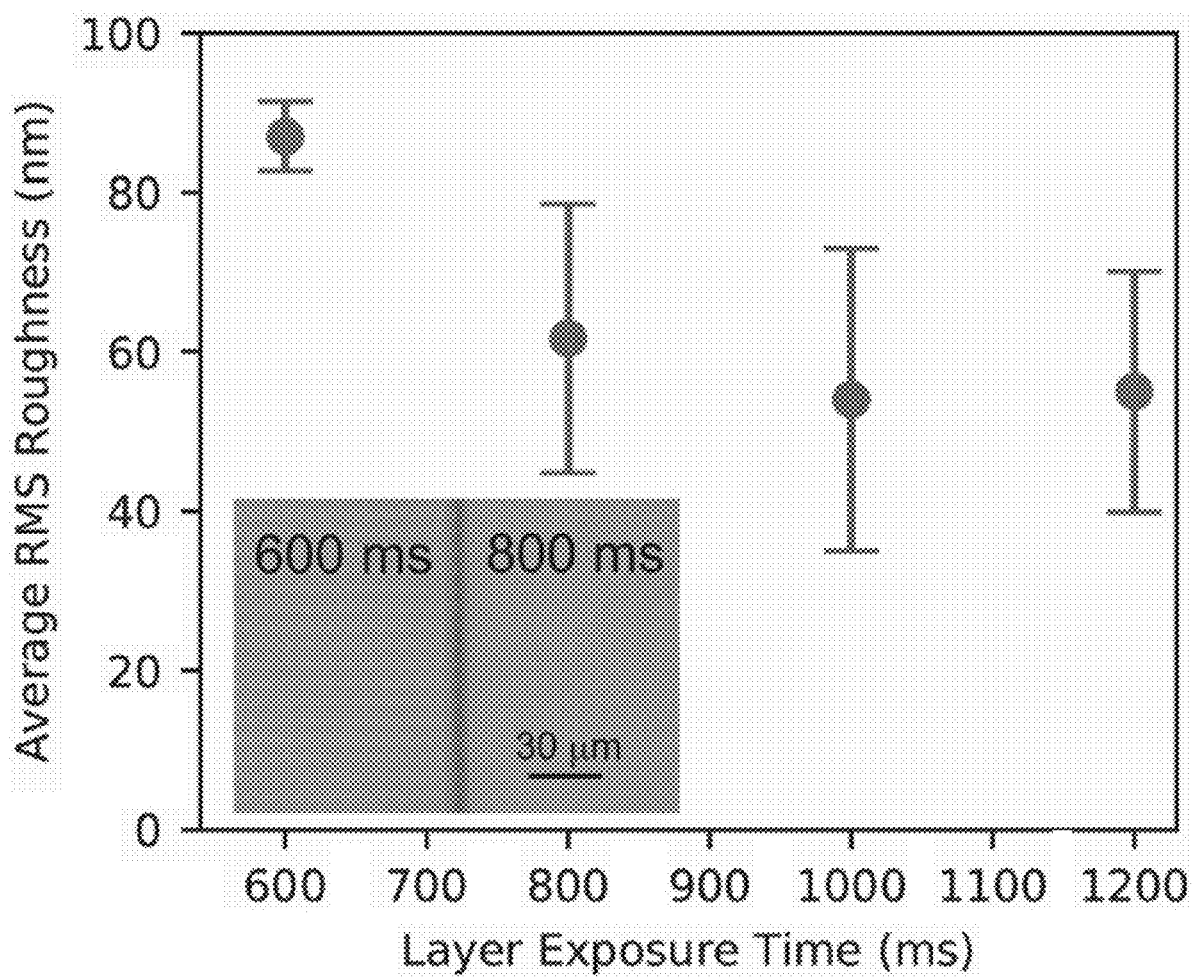

Fortunately, horizontal surfaces as fabricated in the custom 3D printer are exceptionally smooth. As seen in FIG. 14, the average RMS surface roughness is 87 nm for a layer exposure time of 600 ms. The roughness is primarily due to slightly depressed pixel edges as seen in the inset Zeta-20 microscope image as a barely visible square pattern of lines. This in turn is presumably due to the slightly lower optical dose along the projected pixel edges compared to the interior of each pixel region. A lower dose means less crosslinking in the polymer matrix such that some of the material may be marginally soluble in the isopropyl alcohol rinse that follows 3D printing. Note that as the layer dose increases, the average RMS roughness decreases until it asymptotes to ~55 nm. Compared to the 600 ms layer exposure time, an increase of 33% to 800 ms results in a noticeably decreased square pattern in the inset image, indicating that more of the photopolymerized material at the pixel edges remains as part of the final print after rinsing. Since the RMS roughness is already very small at 600 ms exposure time, it was chosen to use this exposure in the tests since longer exposure times involve a trade-off with the minimum achievable channel height.[2-4] It is believed that the smooth as-printed horizontal surfaces in conjunction with the modest flexibility of the 3D printed material (Young's modulus ~7-8 MPa)[4] are the fundamental reasons that the high density interconnects work so well.

3.2 Simple Integrated Microgasket (SIM) Approach

Figure 15A:
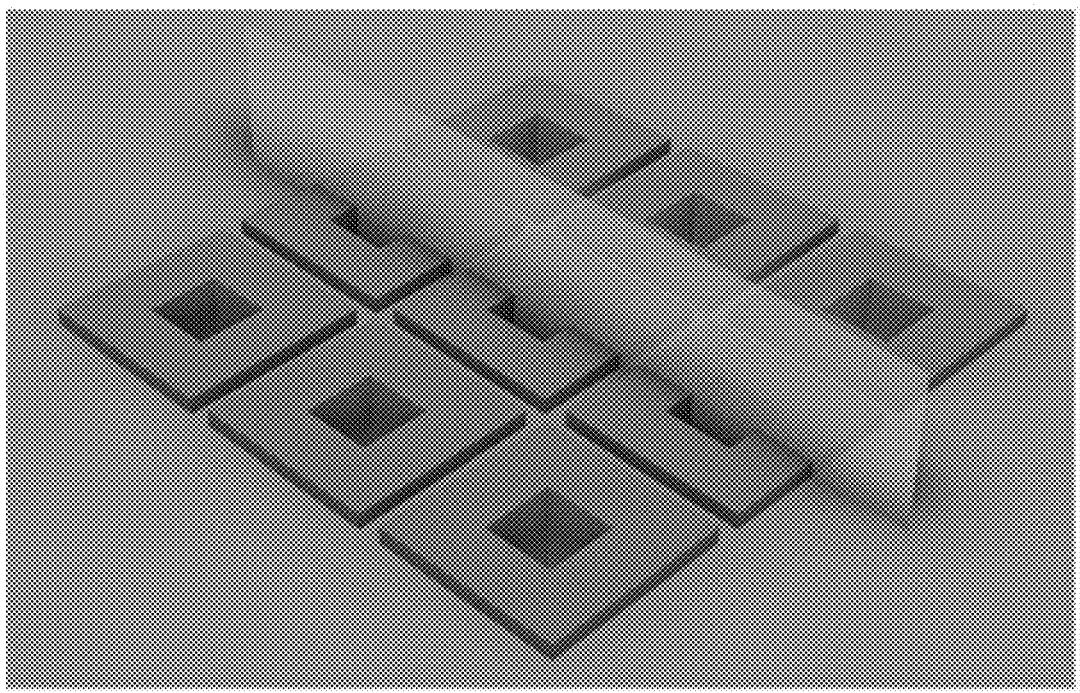
FIG. 15A SIM design. Integrated square microgaskets printed around each vertical channel on the top surface of the device chip. The top surface is in the XY plane with the Z direction being out of the plane.

A simple approach to forming leak-free interconnects is shown in FIG. 15A in which a square microgasket is printed around each vertical channel on the device chip. It was found that tall microgaskets (D=100 μm) typically do not survive more than one clamping event in that many of the microgaskets become crushed. However, if the microgasket is only 10 μm thick (i.e., one build layer), it survives a clamping event without noticeable damage.

Figure 15B:
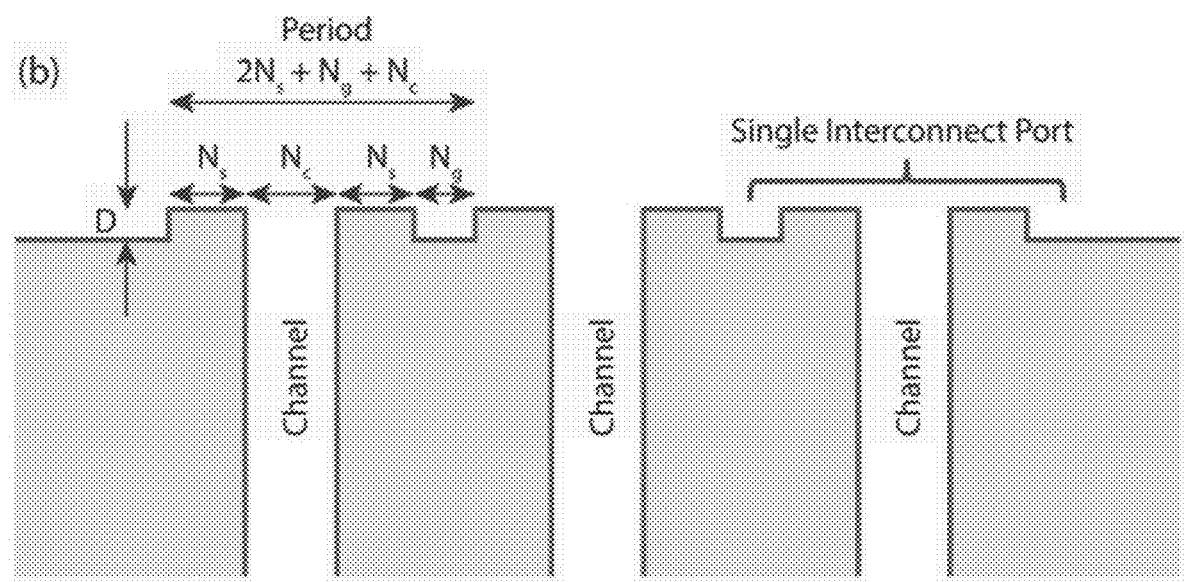
FIG. 15B SIM design: Schematic illustration of the cross section of the vertical plane indicated in FIG. 15A. The microgaskets have a height D above the surrounding planar surface of the chip.

A schematic cross sectional profile of the microgaskets and channels is shown in FIG. 15B. A channel is $N_c$ pixels wide surrounded by a microgasket with an $N_s$ pixel wide sealing surface and a gap of $N_g$ pixels with the next microgasket. The period is $$N_{per}=2N_s+N_c+N_g \qquad (1)$$

pixels, with a physical period of 7.6 μm times $N_{per}$.

Figure 15C:
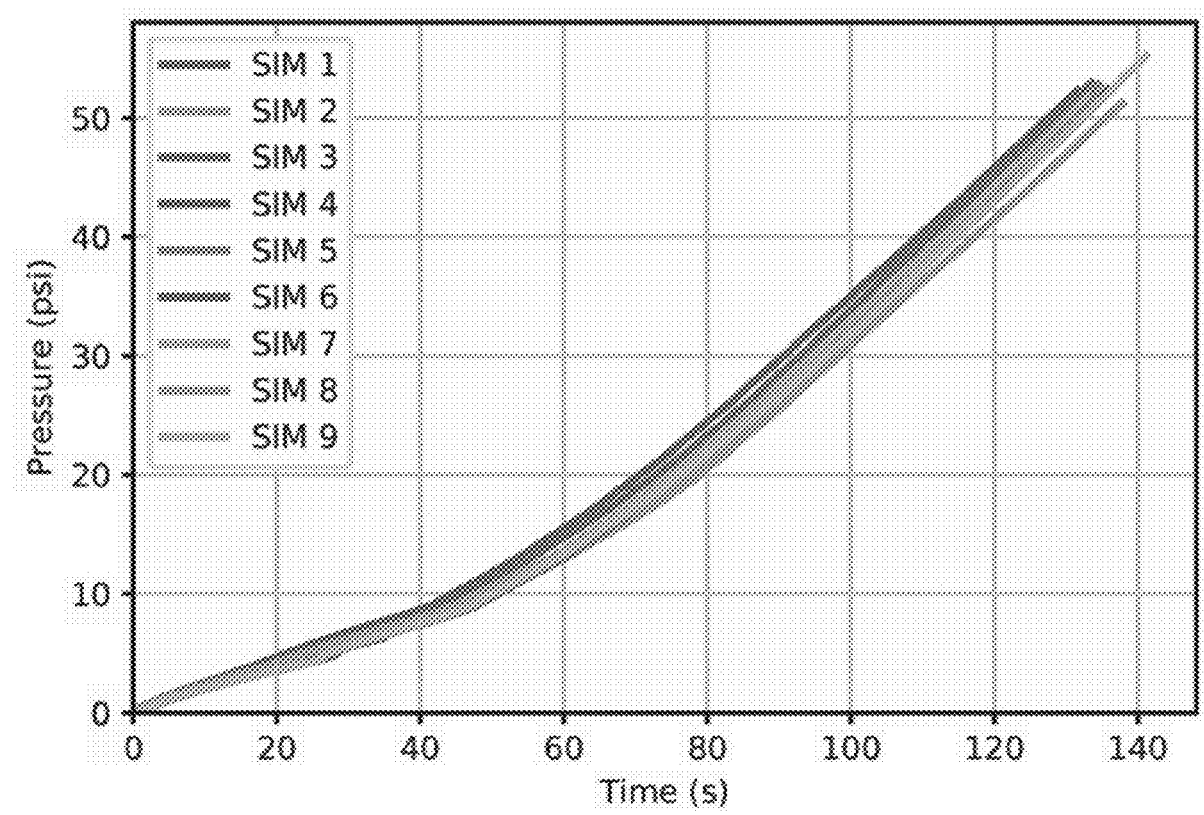
FIG. 15C SIM design: Pressure as a function of time for the test set-up in FIG. 12C using the device and interface chips in FIGS. 13A, 13B, 13C, for each of the 9 chip-to-chip interconnects.

The interface and device chips shown in FIG. 13 (the latter with SIM microgaskets having a microgasket height of D=10 µm) were fabricated with an interconnection period of 24 pixels (182.4 µm) in both X and Y for an areal density of 30 interconnects per mm² (see Table A for geometry details). The pressure test results for each of the 9 interconnects are shown in FIG. 15C, in which the pressure that builds up during syringe pump operation is shown as a function of time for each of the tests. In all cases, the pressure rises monotonically to ~50 psi, at which point the test is terminated because leaks develop in the testing set-up itself (i.e., the syringe gasket and various PTFE tube-to-tube connections). For each test, there is no evidence of leakage in the corresponding interconnect port, indicating that the ports maintain their integrity to at least 50 psi.

TABLE A

Experimentally tested interconnect array sizes and periods

| Leak-free? | Array | $N_c$ | $N_s$ | $N_g$ | Period (pixels) | Period (µm) | Density (mm²) |
|---|---|---|---|---|---|---|---|
| Y | 3 × 3 | 6 | 6 | 6 | 24 | 182.4 | 30.0 |
| Y | 11 × 11 | 6 | 5 | 4 | 20 | 152 | 43.3 |
| Y | 11 × 11 | 6 | 5 | 2 | 18 | 136.8 | 53.4 |
| Y | 20 × 20 | | | | | | |
| Y | 11 × 11 | 6 | 4 | 1 | 15 | 114 | 76.9 |
| Y | 11 × 11 | 6 | 3 | 2 | 14 | 106.4 | 88.3 |
| N | 11 × 11 | 6 | 3 | 1 | 13 | 98.8 | 102.4 |
| N | 11 × 11 | 6 | 2 | 2 | 12 | 91.2 | 120.2 |
| N | 11 × 11 | 6 | 2 | 1 | 11 | 83.6 | 143.1 |

Figure 16A:
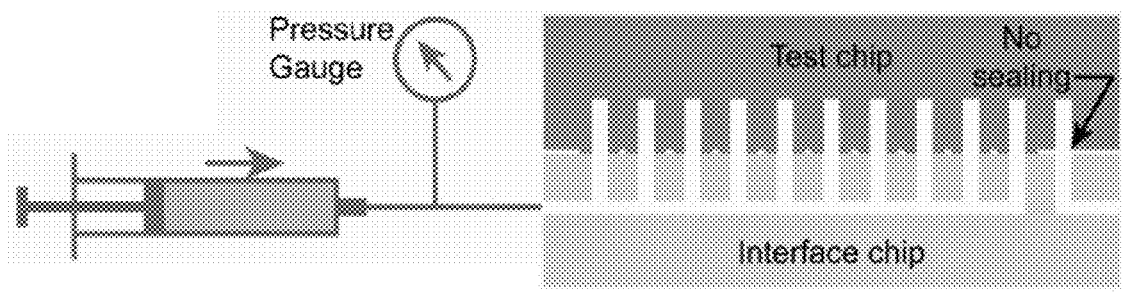
Figure 16B:
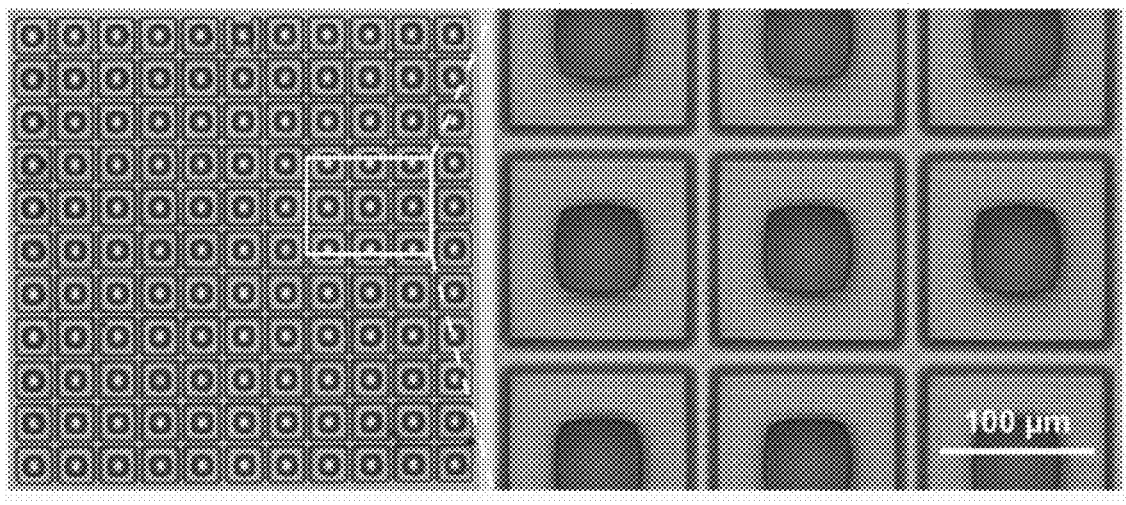
FIG. 16B Composite image from four Zeta-20 microscope images of the fabricated 11×11 array of SIMs. The close-up shows the details of SIMs, including slight pixilation of the sealing surface.

To test a larger number of interconnects at higher density, It was designed with an 11×11 array of interconnects as shown in FIG. 16 with a period of 18 pixels (136.8 µm) in both X and Y for an areal density of 53 interconnects per mm² (third row in Table A) and a microgasket height of D=10 µm. Note that the fidelity and uniformity of the microgasket and vertical channel features are excellent, which is typical for many SIM and CCIM devices that have been 3D printed over several months.

Figure 16C:
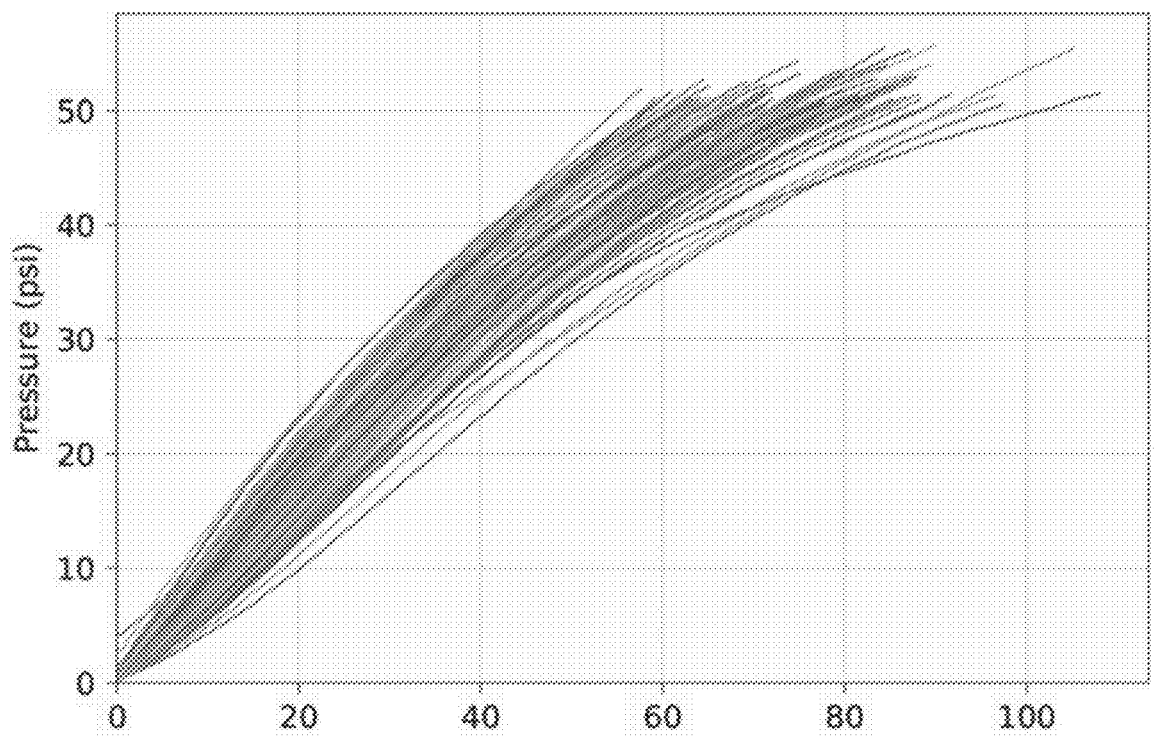
FIG. 16C Pressure as a function of time for the test set-up in FIG. 16A repeated 100 times.

The results of pressure testing for 100 repeated tests are shown in FIG. 16C. The pressure that builds up during syringe pump operation is shown as a function of time for each of the runs. In all cases, there is no evidence of leakage in the interconnect ports, indicating that the ports maintain their integrity to at least 50 psi. As before, testing is terminated at 50 psi due to leaks in the testing apparatus.

3.3 Controlled-Compression Integrated Microgasket (CCIM) Approach

Figure 17A:
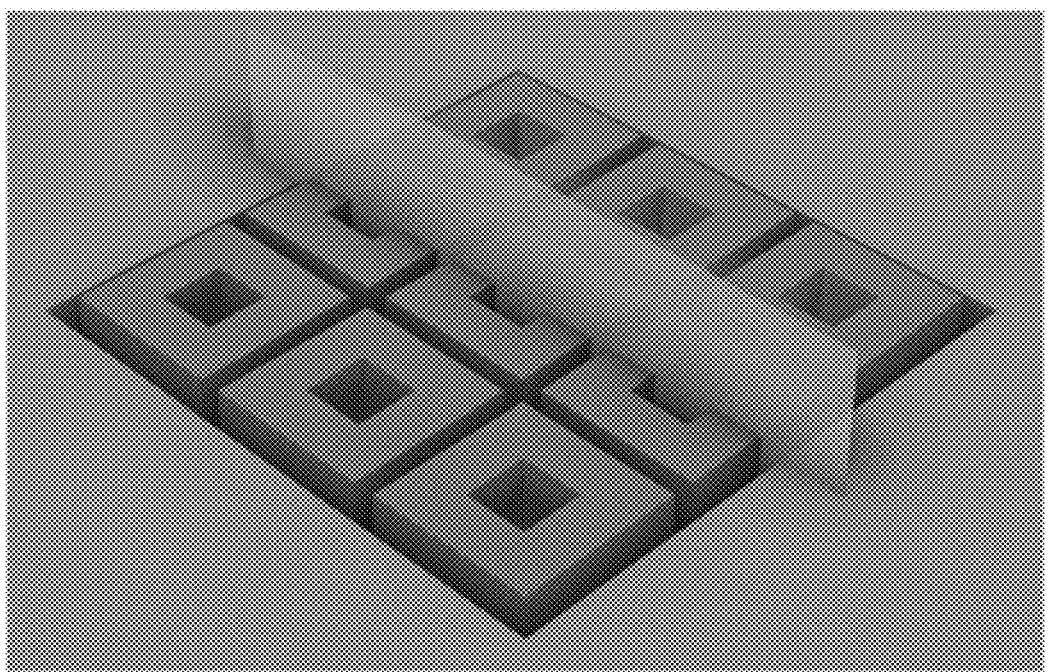
FIG. 17A CCIM design. Integrated microgaskets printed around each vertical channel in a square recess.
Figure 17B:
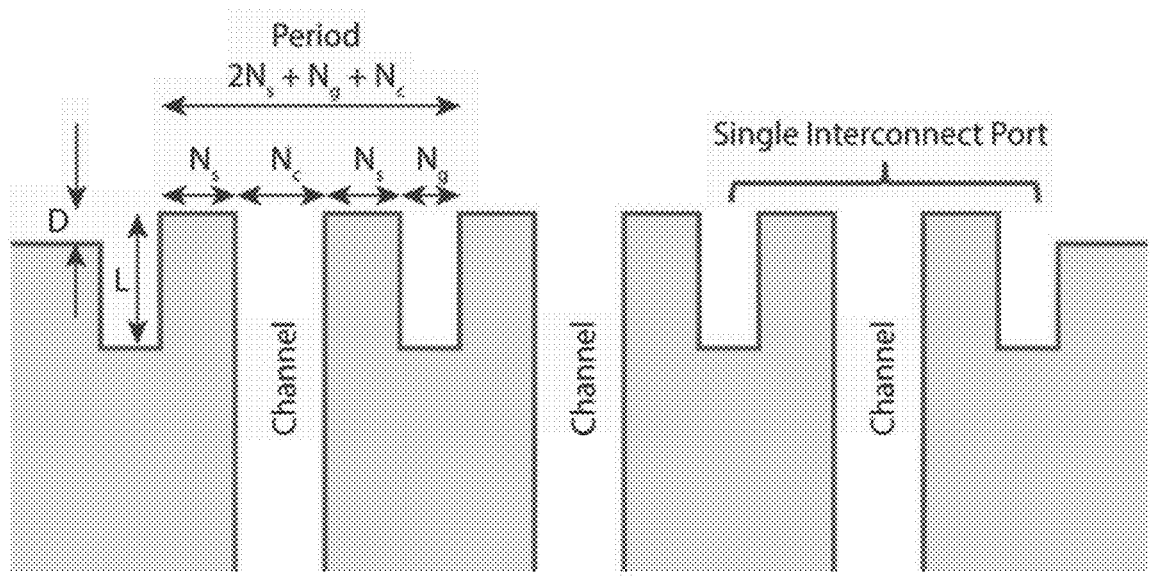
FIG. 17B CCIM design. Schematic illustration of the cross section of the vertical plane in FIG. 17A. The microgaskets have a height D above the surrounding planar surface of the chip.

After 100 pressure tests, the planar surface of the interface chip for the SIM case begins to show slight signs of wear when observed in the Zeta-20. We, therefore, investigated an alternate microgasket design in which the compression of the microgasket is controlled by the geometry of the design (CCIM), as shown in FIGS. 17A and 17B. The design features square microgaskets in a recessed region. The microgasket height, L, is 100 µm and the recess is 90 µm such that D=10 µm as for the SIM case. When the CCIMs on a device chip are clamped to an interface chip, the microgaskets compress 10 µm (i.e., 10% of their height) because the planar surface of the interface chip lands on the surrounding planar surface of the device chip, preventing further compression of the microgaskets. This, therefore, limits the amount of force the microgaskets exert on the corresponding planar surface of the interface chip.

Figure 17C:
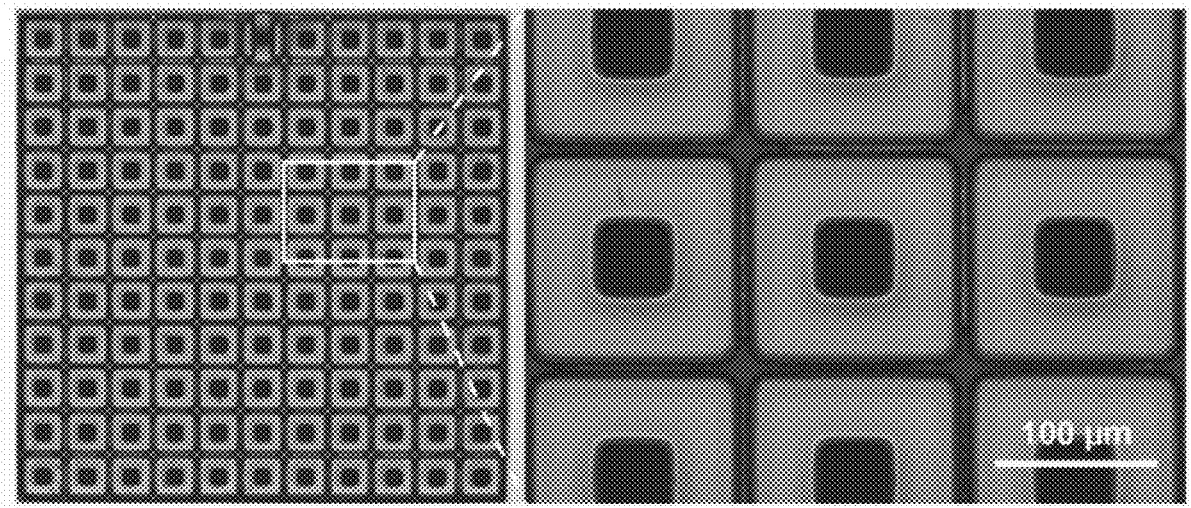
FIG. 17C CCIM design. Composite image from four Zeta-20 microscope images of the fabricated 11×11 array of CCIMs. The close-up shows the details of CCIMs.
Figure 17D:
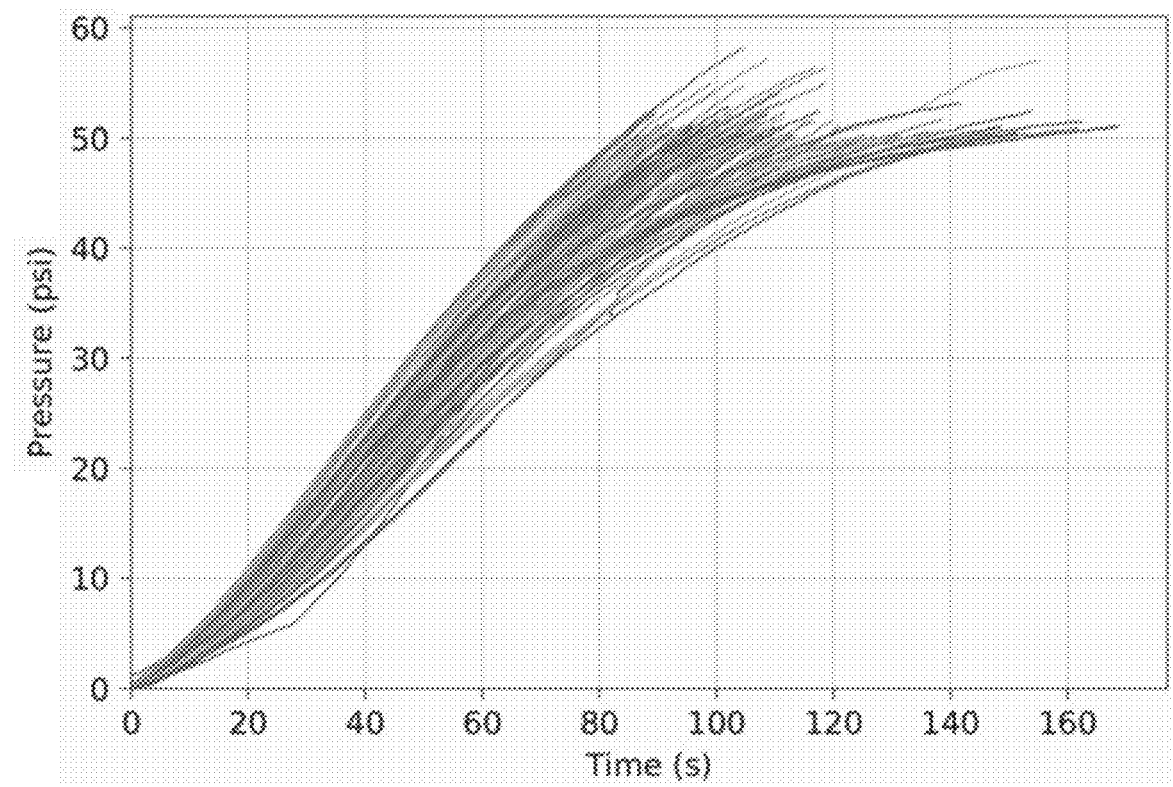
FIG. 17D CCIM design, Pressure as a function of time for the test set-up in FIG. 16A repeated 100 times.

A fabricated 11×11 CCIM device chip is shown in FIG. 17C with the same XY dimensions as the SIM device chip in FIG. 15C (i.e., third row in Table A). The corresponding pressure tests are shown in FIG. 17D. Similar to the SIM device results, the CCIM tests show no evidence of leakage in the interconnect ports. Microscope observation of the interface chip interconnect surface shows less evidence of wear than for the SIM interconnect case. Therefore, focus has been on the CCIM design as the standard high density interconnect method. Note that with 3D printing there is no additional time, cost, or process complexity to fabricate the more complicated CCIM design compared to the SIM design. Nonetheless, the SIM design appears to be suitable for situations in which relatively few repeated sealings are required.

3.4 Scaling

Figure 18A:
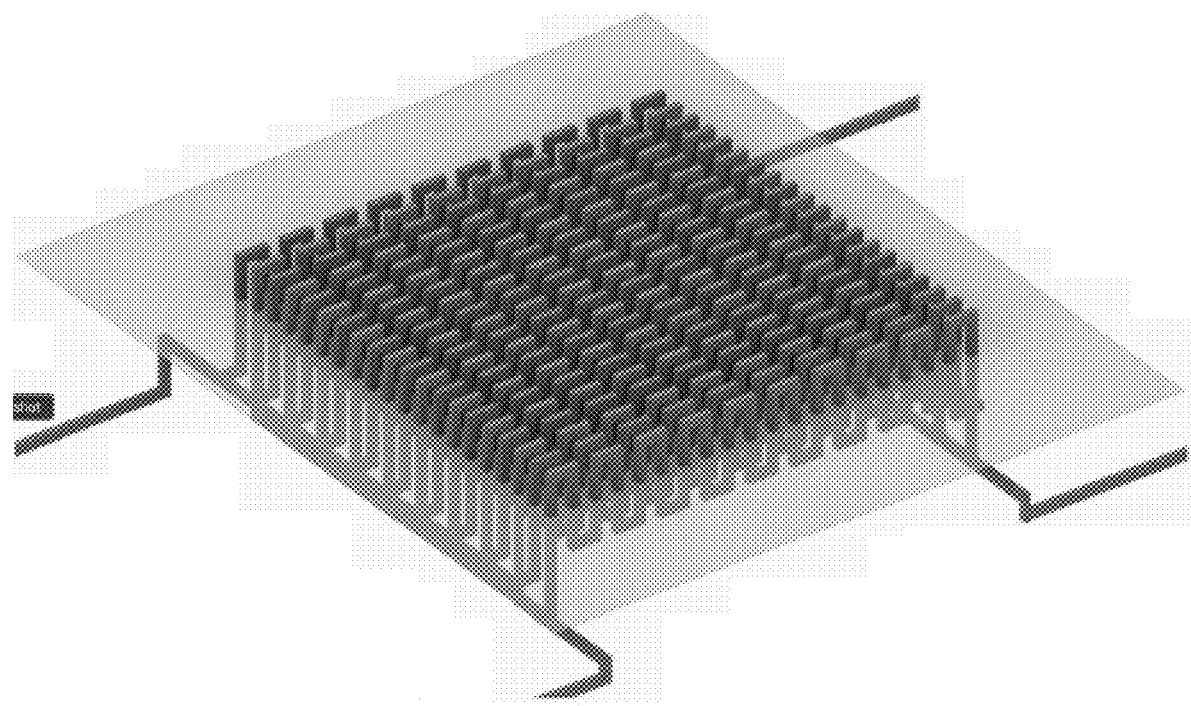
FIG. 18A Schematic illustration of geometry to test 400 CCIM interconnects in a 20×20 array using two independent sets of flow channels (red and blue) that cross up and down between the chips. The plane shows the separation between device (upper) and interface (lower) chips.
Figure 18B:
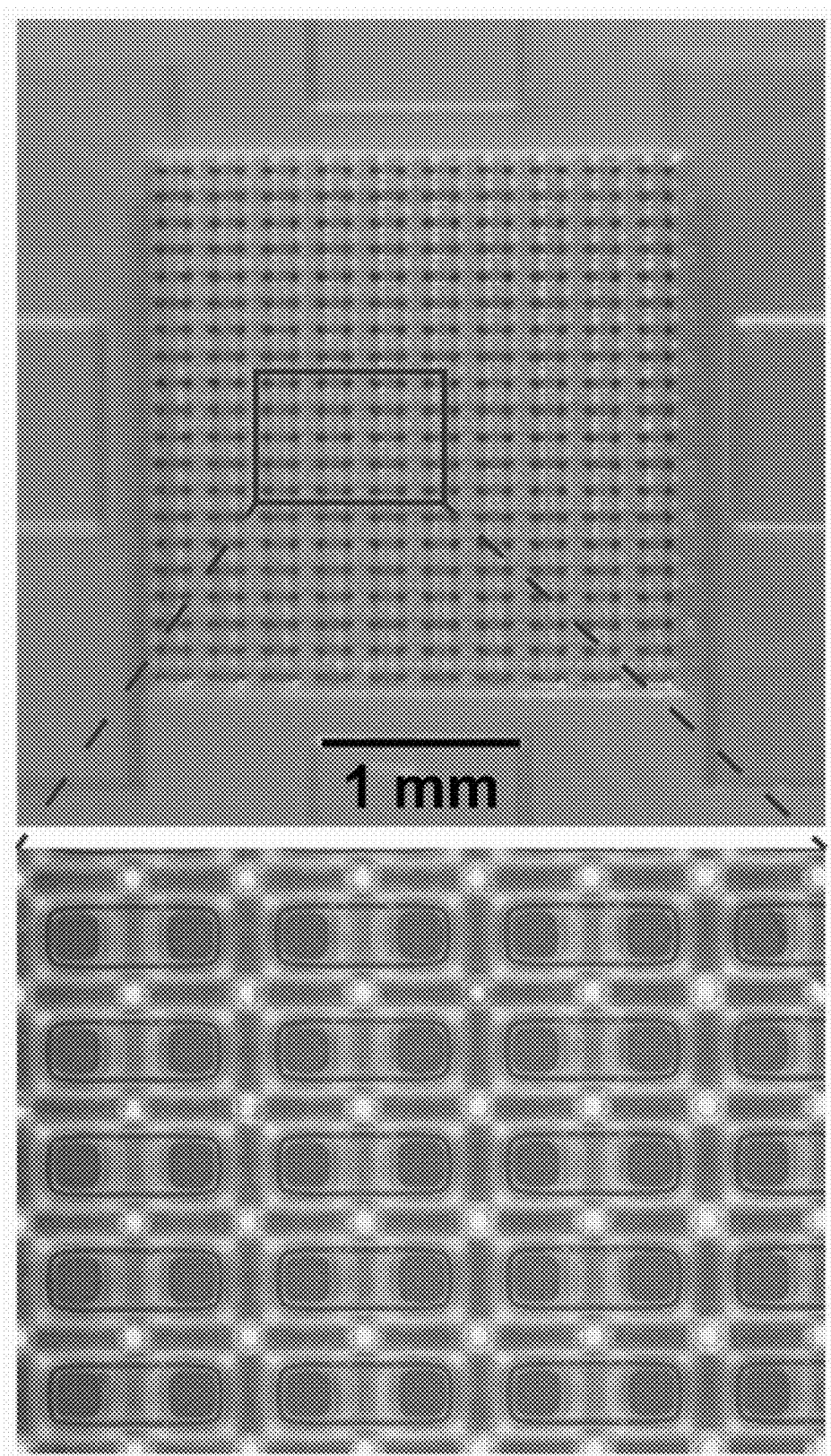
FIG. 18B Photograph of assembled device and interface chips. The two separate flow channels are filled with water containing red and blue food coloring. (Close-up) Microscope image of flow channels.

The potential to scale the CCIM design in sect. 3.3 to larger numbers of interconnects was investigated. Keeping the same XY dimensions, it was found that arrays of 20×20 interconnects are easily achieved. An example is shown in FIG. 18 in which two independent microfluidic channels are vertically routed up and down across the chip-to-chip interface in an area of only 3×3 mm². One channel is filled with red food coloring and the other with blue food coloring. The close-up microscope image in FIG. 18B is focused on the highest horizontal channels in the device chip and shows the very good fidelity and uniformity of the channels and interconnects.

Continuing to scale up the array size with the same CCIM XY dimensions, limitations were found when 1024 interconnects (32×32 array) were reached. A small amount of differential shrinkage between the interface and device chips caused the outer interconnection ports to have enough misalignment that they would not seal. This can be overcome by increasing the size of the microgaskets and therefore the period of the interconnects. However, one might choose not to pursue this approach because of the concomitant decrease in interconnection density.

Instead, evaluated was whether the interconnect density can be increased for 11×11 arrays, the results of which are summarized in Table A. For a vertical channel width, $N_c$, of 6 pixels, it was found that the seal width, $N_s$, could be decreased from 5 pixels to 3 pixels, such that, keeping the gap width, $N_g$, the same at 2 pixels, the period is reduced to 14 pixels (106.4 µm) for an areal density of 88 interconnects per mm². With these dimensions, the interconnects still withstand an internal fluid pressure of 50 psi. Decreasing the period any further results in interconnect arrays that do not fully seal. This appears to be due to shrinkage of the interface chip port geometry which is exacerbated by the relatively smaller volume of polymerized material that results from the high vertical channel density.

4 Demonstration: Valve Testing

CCIM interconnects are used for further 3D printed microfluidic device development efforts because of how convenient it is to separate the chip-to-world interface from the actual device chip. As an example, consider the miniaturization of pneumatic membrane valves enabled by the custom 3D printer and NPS resin. Originally demonstrated are membrane valves with a PEGDA material in 2014 using a conventional cleanroom fabrication process.[18] These valves had a diameter of 700 µm. Initial 3D printed membrane valves using a B9 Creator 3D printer with a custom PEGDA resin were made.[19] Because of the limited resolution (50 µm pixel pitch) of the B9 Creator, the minimum demonstrated valve diameter was 2 mm. After these initial fabrications, it was shown that 1.08 mm diameter valves with a similar custom resin and an Asiga Pico Plus 3D printer having a 27 µm pixel pitch.3 Since our custom 3D printer has a 7.6 µm pixel pitch, this suggests that it should be able to fabricate 300 µm diameter valves (i.e., 1.08 mm×(7.6 µm/27 µm)), which was demonstrated in this section.

Figure 19A:
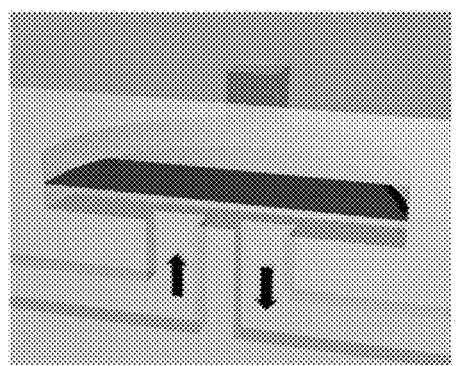
FIG. 19A Schematic diagrams of the 3D printed pneumatically actuated membrane valve in open state (after ref. 3).
Figure 19B:
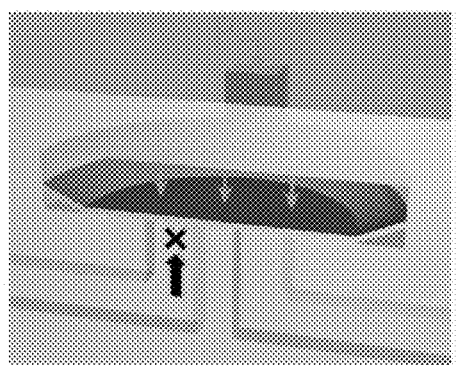
FIG. 19B Schematic diagrams of the 3D printed pneumatically actuated membrane valve in closed state (after ref. 3).
Figure 19C:
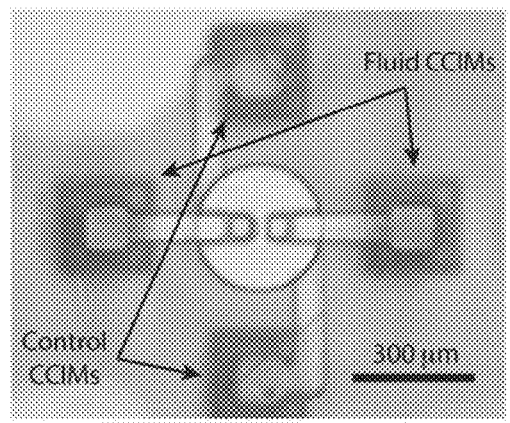
FIG. 19C Single 300 µm diameter valve with fluid and control channels connected to individual CCIMs.

FIGS. 19A and 19B show the geometry of a 3D printed mem-brane valve. FIG. 19C shows a 300 µm diameter 3D printed valve with its two fluid channels and two control channels connected to CCIMs such that the PTFE tubing chip-to-world connections are made with a separate interface chip. The valve membrane consists of two stacked 5 µm layers, each exposed for 300 ms, and fluid and control chambers (i.e., the regions below and above the membrane in FIG. 19A) that are 20 µm and 30 µm tall, respectively. A control pressure of 9 psi works well to close such valves.

Figure 19D:
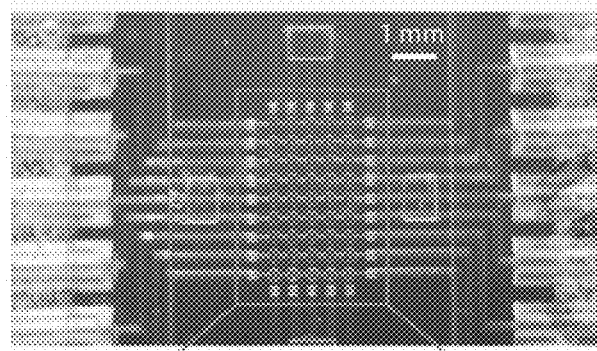
FIG. 19D, FIG. 19E In FIG. 19D a Microscope image of the 45-valve array chip assembled with the corresponding interface chip in clamping fixture as shown in FIG. 19E.
Figure 19D:
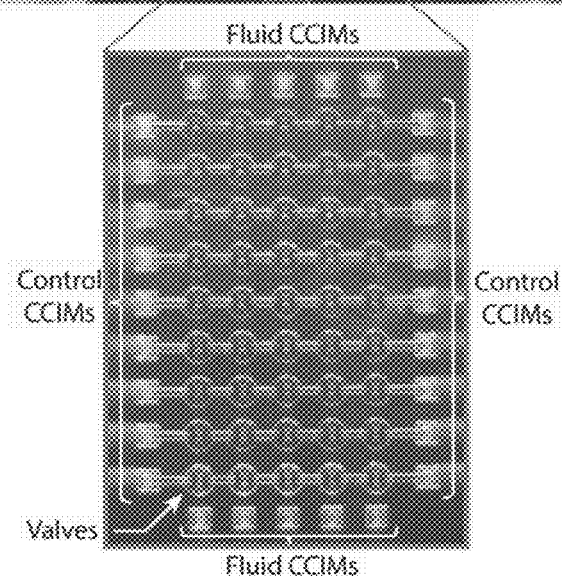
Figure 19E:
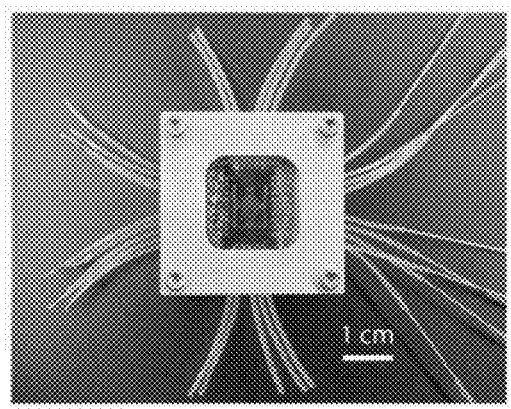

To test the valves, an array of 45 valves was constructed that was arranged in 9 rows and 5 columns, as shown in FIG. 19D. The control chambers of each row of valves are connected in series to a pair of CCIMs, and the fluid chambers of each column of valves are likewise connected in series to a pair of CCIMs such that there are a total of 28 CCIMs. The CCIMs are arranged around the periphery of the valve array, rather than concentrated in a small area as in sect. 3. An interface chip connects these CCIMs through fluid channels to a set of 28 PTFE tubes, as shown in FIG. 19E, in which the interface and valve array chips are clamped together. The photograph in FIG. 19D is taken through the glass substrate of the valve array chip and focused on the valve array, which means the CCIMs and channels in the interface chip are somewhat out of focus since they are outside the depth of focus of the camera's imaging system.

After 3D printing, unpolymerized resin is flushed from the channels and the fluid and control chambers of the valves by first clamping together the valve array and interface chips, after which vacuum and IPA are applied to a pair of tubes connected to one of the rows or columns of valves. This is repeated for each row and each column of valves until all of the unpolymerized resin is flushed (note that flushing unpolymerized resin from a valve's control chamber necessitates two connections to the control chamber). After thorough flushing, the valve array chip is separated from the interface chip and optically cured.

To test the valves, the valve array and interface chips are again clamped with the aluminum fixture. One set of PTFE tubes connected to the control chambers is blocked by inserting small pieces of wire into their ends (the left set of tubes in FIG. 19E), while the other control chamber PTFE tubes are connected to their own solenoid valves and a pressure source. This allows each row of valves to be actuated with a single solenoid valve connected to a manifold pressurized at 9 psi. A water source suspended ~30 cm above the valve chip (and therefore pressurized by gravity) is connected to each column of valves through the top PTFE tubes, and flow is observed through the bottom PTFE tubes as a function of whether any row of valves is actuated or not. The top 8 rows of valves were actuated 10000 times and the bottom row was actuated 1 000 000 times, after which all of the valves still function normally. A video of valve operation after this lifetime testing is shown in Video S1,† where they are actuated with a 50 ms scrolling cycle.

In is finally noted that he interface chip and its 28 world-to-chip connections have been reused to test a variety of 3D printed test chips containing different sized valves, displacement chambers,[3] and pumps. Interconnect chip reuse has proven to be an extremely convenient laboratory benefit of CCIMs.

5 Conclusions

It has been shown that high density chip-to-chip interconnections are feasible between two 3D printed chips using only 3D printed structures on the chips themselves, i.e., no additional materials or parts are needed to effect a seal between the chips other than a mechanism to press the chips together. It has also been shown that passive integrated alignment structures are sufficient to attain the necessary alignment accuracy between the two chips. Both SIM and CCIM geometries have been introduced for integrated microgaskets and it has been shown that both approaches withstand internal fluid pressures up to at least 50 psi in 11×11 arrays of interconnections with an areal density of 53 interconnects per mm$^2$ and can do so with no degradation in performance for 100 repeated tests. CCIM interconnections have been demonstrated for up to 400 interconnects (20×20) and up to an areal density of 88 interconnects per mm$^2$. SIM and CCIM interconnections, therefore, fulfill the 5 chip-to-chip interconnect criteria set forth in the Introduction, namely, (1) support large numbers of interconnects at (2) high density while (3) withstanding pneumatic and fluid pressures typical for 3D printed microfluidic valves and pumps and that are (4) reusable and (5) easy to align and connect.

In addition, it has been shown an application of spatially distributed CCIMs in which they are used to simplify the testing of a 45 valve array with 28 world-to-chip interconnects, in the course of which it has been demonstrated the smallest 3D printed valves known to date (300 µm diameter).

In the above description, the focus has been on connecting a single device chip to an interface chip. It should be noted that it is also possible to connect multiple device chips to the same interface chip and either drive them all in parallel or create some combination of parallel and independent fluid and pneumatic connections. As a further observation, device chips could also be stacked vertically, one underneath another, with high density interconnections on both their top and bottom surfaces to chain them together. Finally, the 3D printed interface chip need not be only a passive device to route world connections to device chips; it could also incorporate active functions.

TABLE OF REFERENCES FOR PART II "3D PRINTED HIGH DENSITY, REVERSIBLE, CHIP-TO-CHIP MICROFLUIDIC INTERCONNECTS"

1. M. J. Beauchamp, G. P. Nordin and A. T. Woolley, Anal. Bioanal. Chem., 2017, 1-9.
2. H. Gong, M. Beauchamp, S. Perry, A. T. Woolley and G. P. Nordin, RSC Adv., 2015, 5, 106621-106632
3. H. Gong, A. T. Woolley and G. P. Nordin, Lab Chip, 2016, 16, 2450-2458.
4. H. Gong, B. P. Bickham, A. T. Woolley and G. P. Nordin, Lab Chip, 2017, 17, 2899-2909.
5. A. A. S. Bhagat, P. Jothimuthu, A. Pais and I. Papautsky, J. Micromech. Microeng., 2006, 17, 42.
6. S. Miserendino and Y-C. Tai, Sens. Actuators, A, 2008, 143, 7-13.
7. G. A. Cooksey, A. L. Plant and J. Atencia, Lab Chip, 2009, 9, 1298-1300.
8. D. Sabourin, D. Snakenborg and M. Dufva, J. Micromech. Microeng., 2009, 19, 035021.
9. R. Lo and E. Meng, J. Micromech. Microeng., 2011, 21, 054021.
10. A. Chen and T. Pan, Lab Chip, 2011, 11, 727-732.
11. P. Skafte-Pedersen, C. G. Sip, A. Folch and M. Dufva, J. Micromech. Microeng., 2013, 23, 055011.

12. E. Wilhelm, C. Neumann, T. Duttenhofer, L. Pires and B. E. Rapp, Lab Chip, 2013, 13, 4343-4351.
13. A. Pfreundt, K. B. Andersen, M. Dimaki and W. E. Svendsen, J. Micromech. Microeng., 2015, 25, 115010.
14. S. Zhao, R. Chen, Y. Yu, L. He, J. Liu, X. Chen and S. Qin, RSC Adv., 2015, 5, 97422-97426.
15. P. F. Wagler, U. Tangen, J. Ott and J. S. McCaskill, IEEE Trans. Compon., Packag., Manuf. Technol., 2015, 5, 291-300.
16. Y. Temiz, R. D. Lovchik, G. V. Kaigala and E. Delamarche, Microelectron. Eng., 2015, 132, 156-175.
17. G. P. Nordin, H. Gong and A. T. Woolley, MicroTAS 2017, Keynote address, slides available at DOI: 10.5281/zenodo.1133980.
18. C. I. Rogers, J. B. Oxborrow, R. R. Anderson, L.-F. Tsai, G. P. Nordin and A. T. Woolley, Sens. Actuators, B, 2014, 191, 438-444.
19. C. I. Rogers, K. Qaderi, A. T. Woolley and G. P. Nordin, Biomicrofluidics, 2015, 9, 1-9

What is claimed is:

1. A method of manufacturing a microfluidic device comprising:
constructing the microfluidic device layer by layer by applying a layer of uncured resin and curing to cross-link the layer by exposure to UV light from a UV source, for the exposure of each individual layer;
patterning the exposure of the UV source to expose at least a portion of the layer to cure the resin in that portion and to optionally leave one or more portions unexposed to leave uncured resin in those portions,
including in the resin of the layer a UV light absorber having an absorption spectrum that fully overlaps the spectrum of the UV source to result in a spectral overlap,
the thickness of the layer sufficiently small, and the exposure to UV light of a duration to crosslink resin in the exposed portions of the layer corresponding to the exposure pattern,
without UV penetrating to any layer underlying the layer due to the UV light absorber, sufficient to cure uncured resin portions in the underlying layer,
flushing uncured resin from the unexposed portions of the constructed layered microfluidic device to result in a microfluidic device with voids, the voids interconnected to function as microfluidic components.

2. A method as in claim 1 wherein the UV light absorber includes 2-nitrophenyl phenyl sulfide (NPS).

3. A method as in claim 1 wherein the UV source has a wavelength of 385 nm.

4. A method as in claim 1 wherein each layer is exposed to UV light by multiple successive exposures, each exposure patterned to result in a layer with cured portions having a different degree of crosslinking in the layer.

5. A method as in claim 4 wherein the different degree of crosslinking includes higher crosslinking adjacent to uncured portions to better define wall of voids in the final microfluidic device.

6. A method as in claim 5 wherein the voids includes channels with a dimension of 18 to 100 μm.

7. A method of manufacturing a microfluidic device comprising:
constructing the microfluidic device layer by layer by applying a layer of uncured resin and curing to cross-link the layer by exposure to UV light from a UV source,
for the exposure of each individual layer;
the exposure of each layer comprising multiple exposures, each exposure patterned by the UV source to expose at least a portion of the layer to cure the resin in that portion and to optionally leave one or more portions unexposed to not cure resin in those portions, the exposure patterns of the multiple exposures designed to result in a layer with any combination of cured portions having a different degree of cross-linking, and uncured portions,
the thickness of the layer sufficiently small, and the exposure to UV light of a time to crosslink resin in the exposed portions of the layer corresponding to the exposure pattern,
without UV penetrating to any layer underlying the layer sufficient to cure uncured resin portions in the underlying layer,
flushing uncured resin from the unexposed portions of the constructed layered microfluidic device to result in a microfluidic device with voids corresponding to the uncured portions in the layers, the voids interconnected to function as microfluidic components.

8. A method as in claim 7 wherein dose of UV light can be adjusted during exposure for each individual layer by selecting duration of each exposure, pattern of each exposure, and number of exposures such that an area the individual layer can have a different UV dose, and consequently degree of cross-linking of resin, from other areas.

9. A method as in claim 8 wherein on the individual layer, the area immediately adjacent to an uncured area has higher dose that other areas on the layer.

10. A method as in claim 9 wherein the area immediately adjacent to an uncured area corresponds in the microfluidic device to a channel wall adjacent to a channel.

11. A method as in claim 7 where the resin of the layer includes a UV light absorber having an absorption spectrum that fully overlaps the spectrum of the UV source to result in a spectral overlap.

12. A method as in claim 7 wherein the different degree of crosslinking includes higher crosslinking adjacent to uncured portions to better define wall of voids in the final microfluidic device.

13. A method for interconnecting microfluidic devices comprising:
providing a first microfluidic device with one or more microfluidic ports on a first flat surface,
providing a second microfluidic device with one or more microfluidic ports on a second flat surface,
the second microfluidic device having one or more integrated microgaskets on the second flat surface, an individual microgasket surrounding a microfluidic port on the second surface,
alignment structure on the first microfluidic device and the second microfluidic device that align to hold the fluid ports of the first and second microfluidic devices in alignment,
the microgaskets, and alignment structure on the second fluidic device formed as an integrated structure with the device using a 3D printing layer by layer method by applying repeatedly a layer of uncured resin and curing to crosslink the layer by exposure to UV light from a UV source,
providing a clamping force that forces together the first flat surface of the first fluidic device, and the microgaskets on the second flat surface to compress the microgaskets and form a fluid seal against the second first flat surface around the microgasket-surrounded microfluidic port, at least one of the microfluidic ports positioned on the first flat surface to align with microfluidic ports positioned on the second flat surface such that under the clamping force, there is fluidic communication between the first microfluidic device and the second microfluidic device through microfluidic ports.

14. The method as in claim 13 wherein the first microfluidic device is a device microfluidic chip, and
the second microfluidic device is an interface chip having one or more to-world interfaces with fluid connection to the microfluidic ports on the second flat surface.

15. A method as in claim 13 wherein the first microfluidic device is an interface chip having multiple to-world interfaces with fluid connection to the first microfluidic ports on the first flat surface, and
the second microfluidic device is a device chip.

16. A method as in claim 15 wherein the device chip, alignment structures, and microgaskets are formed as a single integrated structure using a 3D printing layer by layer method by applying repeatedly a layer of uncured resin and curing to crosslink the layer by exposure to UV light from a UV source.

17. A method as in claim 13 wherein the first microfluidic device is a device chip and the second microfluidic device is a device chip.

18. A method as in claim 17 wherein for both device chips, the device chip, alignment structures, and microgaskets are formed as a single integrated structure using a 3D printing layer by layer method by applying repeatedly a layer of uncured resin and curing to crosslink the layer by exposure to UV light from a UV source.

19. A method as in claim 13 wherein the integrated microgasket on the second surface is surrounded by a trench open at the surface that allows the microgasket to compress and displace into the trench from pressure exerted by the clamping force to even sealing force of the microgasket.

20. A method as in claim 13 wherein the microfluidic ports positioned on the first flat surface to align with the microfluidic ports positioned on the second flat surface are arranged in an array.

21. A method as in claim 20 wherein the array is at least 3×3.

22. A method as in claim 13 wherein the microfluidic ports positioned on the first flat surface to align with the microfluidic ports positioned on the second flat surface are not arranged in an array.

* * * * *